(12) United States Patent
Mohammadi et al.

(10) Patent No.: US 11,349,503 B2
(45) Date of Patent: May 31, 2022

(54) PHASE SHIFTER WITH COMPENSATION CIRCUIT

(71) Applicant: Qualcomm Incorporated, San Diego, CA (US)

(72) Inventors: Laya Mohammadi, San Diego, CA (US); Chirag Dipak Patel, San Diego, CA (US); Bhushan Shanti Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/001,568

(22) Filed: Aug. 24, 2020

(65) Prior Publication Data

US 2022/0060200 A1 Feb. 24, 2022

(51) Int. Cl.
*H04B 1/00* (2006.01)
*H03F 3/19* (2006.01)
*H04B 1/525* (2015.01)
*H03F 1/32* (2006.01)
*H04B 1/04* (2006.01)

(52) U.S. Cl.
CPC ......... *H04B 1/0039* (2013.01); *H03F 1/3247* (2013.01); *H03F 3/19* (2013.01); *H04B 1/0483* (2013.01); *H04B 1/525* (2013.01); *H03F 2200/451* (2013.01)

(58) Field of Classification Search
CPC .... H03G 3/3047; H03G 1/0088; H03G 3/301; H03H 11/22
See application file for complete search history.

(56) References Cited

U.S. PATENT DOCUMENTS 4,977,382 A * 12/1990 Podell ..................... H01P 1/185
333/156
5,168,242 A * 12/1992 Willems .................. H03F 3/604
330/286

(Continued)

FOREIGN PATENT DOCUMENTS

CN 103986439 A * 8/2014
EP 2498402 A1 * 9/2012 ............... H03H 7/19

OTHER PUBLICATIONS

A. Keerti, Junyang Xiang and Anh-Vu Pham, "High power linearized RF phase shifter using anti-series diodes," in IEEE Microwave and Wireless Components Letters, vol. 16, No. 4, pp. 200-202, Apr. 2006, doi: 10.1109/LMWC.2006.872121. (Year: 2006).*

(Continued)

*Primary Examiner* — Berhanu Tadese
(74) *Attorney, Agent, or Firm* — Colby Nipper/Qualcomm

(57) ABSTRACT

An apparatus is disclosed for phase-shifting signals with a compensation circuit. In example implementations, an apparatus for phase-shifting signals includes a phase shifter having a first port and a second port. The phase shifter also includes a signal phase generator, a compensation circuit, and a vector modulator. The compensation circuit includes a first capacitor with a first capacitance and a second capacitor with a second capacitance. The first capacitance is different from the second capacitance. The signal phase generator is coupled between the first port and the compensation circuit. The vector modulator is coupled between the compensation circuit and the second port.

30 Claims, 12 Drawing Sheets

(56) References Cited

U.S. PATENT DOCUMENTS

| | | | | |
|---|---|---|---|---|
| 5,168,250 | A * | 12/1992 | Bingham | H03F 1/18 |
| | | | | 333/139 |
| 6,853,691 | B1 * | 2/2005 | Kim | H04L 27/362 |
| | | | | 375/308 |
| 7,271,647 | B2 * | 9/2007 | Cao | H03H 11/22 |
| | | | | 327/552 |
| 8,203,394 | B2 * | 6/2012 | Kim | H04B 7/10 |
| | | | | 332/103 |
| 8,461,901 | B1 * | 6/2013 | Morton | H03D 7/1441 |
| | | | | 327/355 |
| 9,438,463 | B2 | 9/2016 | Grasso et al. | |
| 9,667,235 | B1 * | 5/2017 | Wyse | H01P 1/18 |
| 9,967,115 | B1 * | 5/2018 | Zhang | H03F 3/45201 |
| 10,476,157 | B1 * | 11/2019 | Segoria | H01Q 3/36 |
| 2012/0229227 | A1 * | 9/2012 | Choi | H03C 5/00 |
| | | | | 332/144 |
| 2014/0099893 | A1 * | 4/2014 | Kheirkhahi | H04J 11/0023 |
| | | | | 455/41.2 |
| 2014/0152399 | A1 * | 6/2014 | Ehyaie | H03H 7/20 |
| | | | | 333/139 |
| 2014/0170991 | A1 * | 6/2014 | Song | H04B 1/38 |
| | | | | 455/73 |
| 2015/0207486 | A1 * | 7/2015 | Ehyaie | H03H 7/20 |
| | | | | 375/257 |
| 2016/0065179 | A1 * | 3/2016 | Taghivand | H03H 7/0153 |
| | | | | 327/554 |
| 2018/0175806 | A1 * | 6/2018 | Mehrjoo | H03F 1/3205 |
| 2019/0089308 | A1 * | 3/2019 | Kanar | H03F 3/245 |
| 2019/0172635 | A1 * | 6/2019 | Ku | H01F 30/12 |
| 2019/0199334 | A1 * | 6/2019 | Chakraborty | H04B 7/0452 |
| 2019/0229699 | A1 * | 7/2019 | Joshi | G01S 13/02 |
| 2020/0350679 | A1 * | 11/2020 | Yu | H03F 3/45179 |
| 2020/0382088 | A1 * | 12/2020 | Saha | H03G 3/3047 |
| 2021/0067041 | A1 * | 3/2021 | Cho | H02M 1/32 |
| 2021/0067118 | A1 * | 3/2021 | Patel | H03F 3/62 |
| 2021/0175589 | A1 * | 6/2021 | Patel | H03F 3/245 |

OTHER PUBLICATIONS

H. Zarei, C. T. Charles and D. J. Allstot, "Reflective-Type Phase Shifters for Multiple-Antenna Transceivers," in IEEE Transactions on Circuits and Systems I: Regular Papers, vol. 54, No. 8, pp. 1647-1656, Aug. 2007, doi: 10.1109/TCSI.2007.902440. (Year: 2007).*

Kim, "W-band Phased Array Systems using Silicon Integrated Circuits", University of California, San Diego, Sang Young Kim, 2012, 2012, 120 pages.

Koh, et al., "0.13-μm CMOS Phase Shifters for X-, Ku-, and K-Band Phased Arrays", IEEE Journal of Solid-State Circuits, vol. 42, No. 11, Nov. 2007, Nov. 2007, 12 pages.

Yang, et al., "A 90-98 GHz 2×2 Phased-Array Transmitter with High Resolution Phase Control and Digital Gain Compensation", 2019 IEEE/MTT-S International Microwave Symposium, 2019, 4 pages.

Yong, "Phase Generation and Manipulation in CMOS Integrated Circuits", Queen's University, Kingston, Ontario, Canada, Mar. 2008, Mar. 2008, 136 pages.

"International Search Report and Written Opinion", PCT Application No. PCT/US2021/043218, dated Nov. 22, 2021, 15 pages.

Kim, et al., "An Improved Wideband All-Pass I/Q Network for Millimeter-Wave Phase Shifters", IEEE Transactions on Microwave Theory and Techniques, vol. 60, No. 11, Nov. 2012, pp. 3431-3439.

Yan, "An Inductorless RC-Based Quadrature Phase Generator and Its Application to Vector-Sum Phase Shifter", 2014 IEEE 14th Topical Meeting on Silicon Monolithic Integrated Circuits in RF Systems, Jan. 19, 2014, Jan. 19, 2014, 3 pages.

Zheng, et al., "Full 360 Vector-Sum Phase-Shifter for Microwave System Applications", IEEE Transactions on Circuits and Systems I: Regulars Papers, Apr. 1, 2010, Apr. 1, 2010, 7 pages.

\* cited by examiner

PHASE SHIFTER WITH COMPENSATION CIRCUIT

TECHNICAL FIELD

This disclosure relates generally to wireless communications with electronic devices and, more specifically, to implementing a phase shifter.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, thermostats and other sensors or automated controllers, robotics, automotive electronics, devices embedded in other machines like refrigerators and industrial equipment, Internet of Things (IoT) devices, and so forth. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet, a Wi-Fi network, or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal from the base station via the air medium as part of a downlink communication to enable mobile services. With a smartphone, mobile services can include phone and video calls, social media interactions, messaging, watching movies, sharing videos, performing searches, acquiring map information or navigational instructions, finding friends, location-based services generally, transferring money, obtaining another service like a car ride, and so forth.

To provide these and other types of services, electronic devices typically use a wireless transceiver to communicate wireless signals over a wireless network in accordance with some wireless standard. Examples of wireless standards include an IEEE 802.11b/g Wi-Fi standard and a 4th Generation (4G) cellular standard, both of which are used today with smartphones and other connected devices. However, efforts to enable faster wireless networks through the creation of newer wireless standards are ongoing. Next-generation cellular networks and newer Wi-Fi networks, for example, are expected to offer significantly higher bandwidths, lower latencies, and access to additional electromagnetic spectrum. Taken together, this means that exciting new wireless services can be provided to users, such as self-driving vehicles, augmented reality (AR) and other mixed reality (MR) imaging, on-the-go 4K video streaming, ubiquitous sensors to keep people safe and to use natural resources more efficiently, real-time language translation, and so forth.

To make these new, faster wireless technologies more widely available, many wireless devices besides smartphones will be deployed, which is sometimes called the "Internet of Things" (IoT). Compared to today's use of wireless devices, tens of billions, or even hundreds of billions, more devices are expected to be connected to the internet with the arrival of the Internet of Things. These IoT devices may include small, inexpensive, and low-powered devices, like sensors and tracking tags. To enable next-generation wireless technologies, IoT devices and electronic devices generally will operate in accordance with 5th Generation (5G) or subsequent cellular standards and newer Wi-Fi standards. Such devices may communicate with signals that use wider frequency ranges that are located at higher frequencies of the electromagnetic spectrum as compared to those devices that operate in accordance with older wireless standards. For example, newer devices may be expected to operate at millimeter wave (mmWave) frequencies (e.g., frequencies between at least 24 and 300 Gigahertz (GHz)), as well as at frequencies in the single-digit GHz.

To accommodate these commercial expectations and surmount the associated technical hurdles, the physical components that enable wireless communications under these constraints will be expected to operate efficiently at these operating frequencies. One component that facilitates electronic communication is the wireless interface device, which can include a wireless transceiver and a radio-frequency front-end (RFFE). Unfortunately, the wireless interface devices designed for electronic devices that operate in accordance with the Wi-Fi and 4G cellular standards of today are not adequate for the faster Wi-Fi and 5G wireless standards of tomorrow, which standards are expected to accommodate higher frequencies, more-stringent latency demands, and tighter fiscal constraints.

Consequently, to facilitate the adoption of newer cellular and faster Wi-Fi technologies, as well as the widespread deployment of electronic devices that can provide new capabilities and services, wireless interface devices will be deployed having designs that can handle various frequencies, such as mmWave frequencies, deployed in such newer cellular and Wi-Fi technologies. Electrical engineers and other designers of electronic devices are therefore striving to develop new wireless interface devices that will enable the promise of 5G (and beyond), mmWave Wi-Fi, and other technologies to become a reality.

SUMMARY

Newer cellular standards, such as 5G, and newer Wi-Fi standards, such as WiGig®, are intended to establish broadband capabilities at higher frequencies. These higher frequencies include those in the gigahertz (GHz) range, such as frequencies with corresponding millimeter wavelengths (e.g., mmWave frequencies between at least 24-300 GHz). To facilitate wireless communications with mmWave frequencies, some electronic devices use signal beamforming. Signal beamforming entails employing an antenna array to aim a signal beam in a desired direction. Aiming a signal beam from an origin apparatus toward a destination apparatus can decrease an amount of transmit power required to reach the destination apparatus. Further, beamforming enables a signal to be propagated over a greater distance as compared to an omnidirectional transmission, including with transmissions at mmWave frequencies.

To generate a signal beam, multiple antenna elements of an antenna array transmit or receive different versions of a wireless signal, such as different delayed or phase-shifted versions of the wireless signal. In some architectures, a respective component chain is associated with each antenna element of the antenna array to generate a respective wireless signal version. Individual physical components of each component chain are therefore reproduced for each antenna element, and a single electronic device can include many antenna elements, such as 4, 6, 12, 16, or more across multiple antenna arrays. Consequently, a negative effect resulting from any particular physical component that is part of a component chain, such as a size occupied by an individual physical component, is multiplied by a quantity of antenna elements included in the electronic device.

An example of an individual physical component that may be included in each component chain is a phase shifter. A phase shifter can adjust a phase of a version of a wireless signal relative to other versions of the wireless signal to enable beamforming for mmWave and other frequencies of wireless communications. A phase shifter can be constructed using, for example, a signal phase generator and a vector modulator. In example implementations, the signal phase generator converts a signal having one phase to a split signal having at least two phases for at least two components of the signal. In some scenarios, two phases of a split signal are separated by 90 degrees (90°), such as by having 0° and 90° phases. Such a split signal can be referred to as having an in-phase signal component (I phase component) and a quadrature signal component (Q phase component). The vector modulator of the phase shifter adjusts relative amplitudes of the phase components of the split signal. After the phase shifter recombines the amplitude-adjusted components of the split signal, the relative amplitude adjustment effectively changes a phase of the signal flowing through a given component chain, for example to support beamsteering operations.

A phase shifter can be realized with active or passive components. For instance, a phase shifter can include an active vector modulator and a passive signal phase generator. An example of a passive signal phase generator is called a quadrature all-pass filter (QAF). In operation, a QAF can accept a signal with at least one phase and output a split signal having one or more generated phases. In terms of I and Q signal components, an I signal component can be input to the QAF. In response to the I signal component, the QAF generates both an I signal component and a Q signal component such that the generated I and Q signal components are separated in phase by 90°. Unfortunately, with capacitive loading on the QAF, the generated I and Q signal components at the output of the QAF may have an unbalanced amplitude. This unbalanced amplitude can result in erroneous vector modulation and therefore in an incorrectly phase-shifted signal at the output of the phase shifter.

To address this potential for an unbalanced output by a QAF due to capacitive loading on the QAF, a matching circuit can be placed between an output of the QAF and an input of the vector modulator. For example, a matching circuit that uses at least one inductor per signal component can be employed. This can result in at least four inductors with differential signaling to handle the plus and minus parts of both the I and Q signal components. Unfortunately, inductors occupy a significant area of a radio-frequency (RF) integrated circuit (IC). Generally, smaller RF ICs can enable the production of smaller and less expensive devices. Accordingly, electronic devices can be made less expensive by avoiding usage of inductors. Further, any benefit obtained by of avoiding inductor usage in a phase shifter being used for antenna beamforming is multiplied by a quantity of antenna elements deployed in each electronic device.

Instead of relying on a matching circuit having at least one inductor per signal component that is output by a QAF, described implementations include a compensation circuit having a respective capacitor per signal component. In some embodiments, not all of the capacitive values of the capacitors of the compensation circuit are equal to each other. For example, one pair of capacitors may have a first capacitive value, and another pair of capacitors may have a second capacitive value. In example implementations, a phase shifter includes an active vector modulator and a passive signal phase generator that is realized as a QAF. A compensation circuit may be coupled between the signal phase generator and the vector modulator.

For differential signaling environments, the compensation circuit can include four capacitors. Similarly, the QAF can include four branches: two inductive branches and two capacitive branches. An output of each respective branch of the QAF is coupled to an input of the vector modulator using a respective capacitor of the compensation circuit. The two capacitors of the compensation circuit that are coupled to the two inductive branches have a different capacitance than do the other two capacitors that are coupled to the two capacitive branches.

A ratio of capacitive values between larger and smaller capacitances of the capacitors of the compensation circuit can be, for example, greater than approximately two or three. For instance, the capacitive ratio can range between two and five. Using capacitors in the compensation circuit with unbalanced capacitive values may counteract an amplitude imbalance that would otherwise be introduced at the output of the QAF due to capacitive loading that is caused by the vector modulator. Thus, instead of a relatively larger inductor component in a matching circuit, a capacitor in a compensation circuit can be used to couple the QAF branches of the signal phase generator to the vector modulator. In these manners, a phase shifter, which employs a passive QAF signal phase generator, can be realized that is smaller than those implemented with an inductor-based matching circuit by employing a capacitor-based compensation circuit coupled between the signal phase generator and the vector modulator. This area or space reduction and associated cost savings is also multiplied by a quantity of phase shifters present in an electronic device.

In an example aspect, an apparatus for phase-shifting signals is disclosed. The apparatus includes a phase shifter including a first port and a second port. The phase shifter also includes a signal phase generator, a vector modulator, and a compensation circuit. The compensation circuit includes a first capacitor with a first capacitance and a second capacitor with a second capacitance; the first capacitance is different from the second capacitance. The signal phase generator is coupled between the first port and the compensation circuit. The vector modulator is coupled between the compensation circuit and the second port.

In an example aspect, an apparatus for phase-shifting signals is disclosed. The apparatus includes a phase shifter. The phase shifter includes means for generating two or more phase components of a signal based on at least one phase component of the signal. The phase shifter also includes means for balancing at least one amplitude of the two or more phase components generated by the means for generating to produce two or more balanced phase components. The phase shifter additionally includes means for adjusting the two or more balanced phase components responsive to a phase control signal to produce a phase-shifted signal. The phase shifter further includes means for interfacing with the means for generating to provide the signal to the means for generating and means for interfacing with the means for adjusting to accept the phase-shifted signal from the means for adjusting.

In an example aspect, a method for operating a phase shifter with a compensation circuit is disclosed. The method includes accepting, at a first port, a signal with at least one phase component. The method also includes generating, based on the at least one phase component of the signal, two or more phase components of the signal, with the two or more phase components including a first phase component and a second phase component of the signal. The method additionally includes propagating the first phase component through a first capacitor having a first capacitance and the second phase component through a second capacitor having a second capacitance, with the first capacitance being different from the second capacitance. The method also includes modulating the two or more phase components of the signal to produce at least one adjusted phase component of the signal. The method further includes coupling the at least one adjusted phase component of the signal to a second port.

In an example aspect, an apparatus for phase-shifting signals is disclosed. The apparatus includes a phase shifter including a first port having a first node and a second node and a second port having two or more nodes. The phase shifter also includes a compensation circuit, a vector modulator, and a signal phase generator. The compensation circuit includes a first capacitor with a first capacitance, a second capacitor with a second capacitance, a third capacitor with the first capacitance, and a fourth capacitor with the second capacitance. The first capacitance is different from the second capacitance. The vector modulator is coupled between the compensation circuit and the two or more nodes of the second port. The signal phase generator includes a capacitor coupled between the first node of the first port and the first capacitor. The signal phase generator also includes an inductor coupled between the first node of the first port and the second capacitor. The signal phase generator additionally includes another capacitor coupled between the second node of the first port and the third capacitor. The signal phase generator further includes another inductor coupled between the second node of the first port and the fourth capacitor.

BRIEF DESCRIPTION OF DRAWINGS

FIG. 3-1 illustrates an antenna array coupled to an example RF front-end that includes multiple component chains, each of which includes a phase shifter.

FIG. 3-2 illustrates an antenna element coupled to an example portion of a component chain that includes a phase shifter that can be operated bidirectionally.

FIG. 3-3 illustrates an antenna element coupled to an example portion of a component chain that includes two phase shifters that can each be operated unidirectionally.

DETAILED DESCRIPTION

Figure 1:
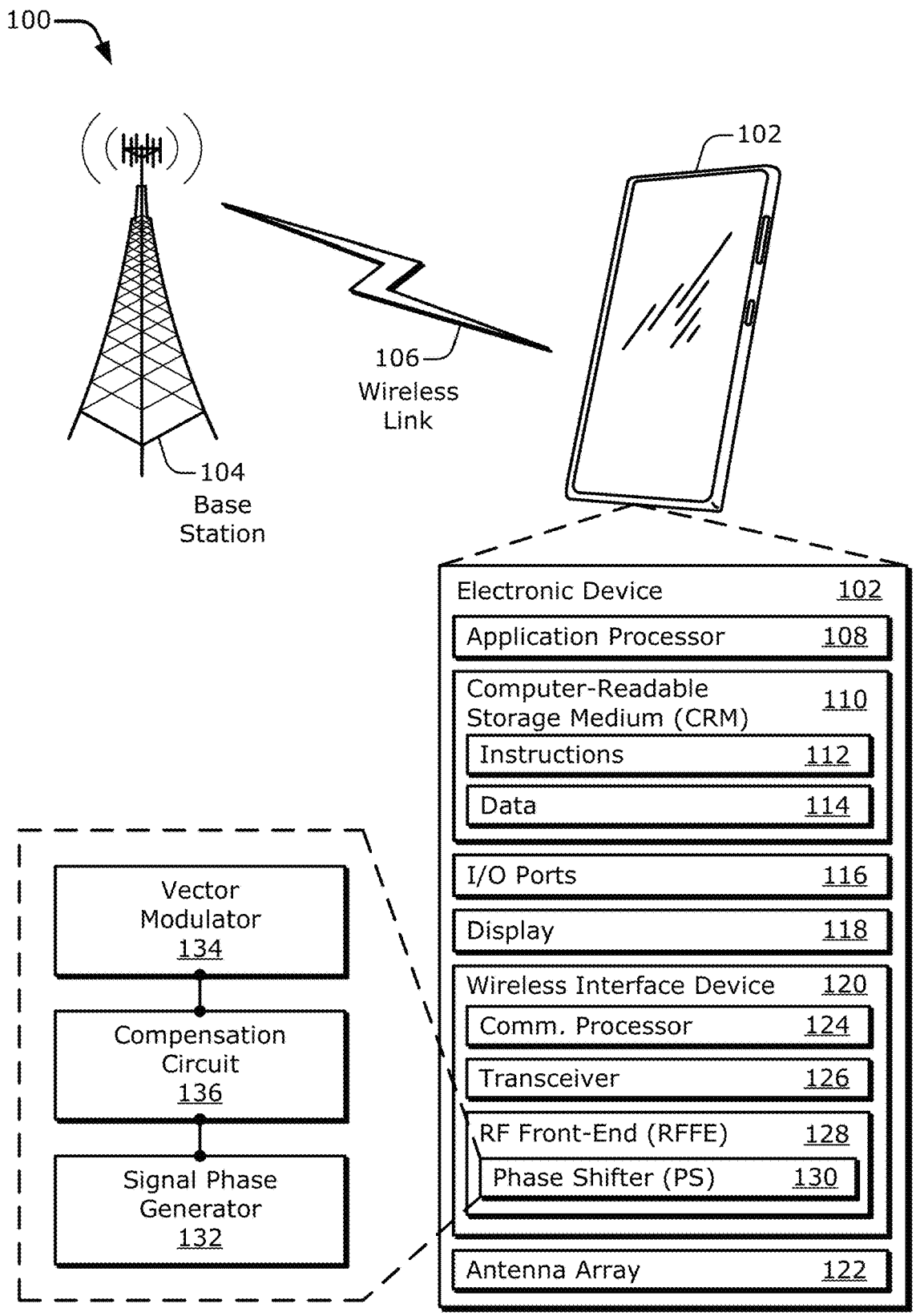
FIG. 1 illustrates an example environment that includes an electronic device having a wireless interface device with a radio-frequency (RF) front-end, which includes a phase shifter with a compensation circuit.

As compared to 4G cellular and existing Wi-Fi networks, next-generation networks, such as 5G cellular and Wi-Gig® Wi-Fi networks, will utilize higher electromagnetic (EM) frequencies. These higher EM frequencies include millimeter wave (mmWave) frequencies that can span approximately 24 to 300 Gigahertz (GHz) of the EM spectrum. Other technologies that can operate at mmWave frequencies include 5G New Radio Spectrum Sharing (5G NR-SS) and WirelessHD®. Although higher frequencies can offer higher bandwidth and lower latency, higher frequencies also present technical challenges. For example, signals transmitted at higher frequencies are attenuated by the atmosphere more quickly and therefore have shorter intrinsic ranges at a given power level. To account for the naturally-shorter propagation distances, signals can be transmitted in signal beams that direct a signal toward a particular target with more effective power, which is called antenna beamforming. Using antenna beamforming a transmission at a given power level can travel farther as a signal beam as compared to an omnidirectional signal.

Thus, electronic devices operating in accordance with 5G cellular, mmWave Wi-Fi, and other wireless standards may utilize beamforming to direct signals toward receiving devices. A wireless interface device of an electronic device is at least partially responsible for generating signal beams for beamformed communications. To form a transmission signal beam, a wireless interface device uses an antenna array to emanate multiple versions of a transmission signal in which the versions are modified with respect to each other to cause the signal versions to constructively and destructively combine during signal propagation. The modifications of the different signal versions can include being amplified by different amounts or being phase shifted with respect to each other (e.g., delayed relative to one another by different time durations). Areas of constructive EM combination produce a signal beam that can be received at relatively farther distances as compared to signal transmissions without using antenna beamforming. Receiving a communication signal with beamforming techniques works in a reverse manner by processing the different signal versions to reconstruct a received signal beam.

Generally, each signal version is provided to or accepted from a respective antenna element of an antenna array of an electronic device. To modify different signal versions corresponding to respective ones of different antenna elements of the antenna array, a wireless interface device that is coupled to the antenna array may include a respective component chain of multiple component chains for each respective antenna element of multiple antenna elements. Further, the electronic device may include multiple antenna arrays that each have multiple antenna elements to aim signal beams from different sides of the electronic device.

In some architectures, a component chain is therefore associated with and coupled to each antenna element of each antenna array. Individual physical components of each component chain are thus reproduced for each antenna element. Generally, antenna elements are grouped into antenna arrays that can have 2 to 5 or more antenna elements. Because each electronic device can have 2, 3, or more antenna arrays, a total quantity of antenna elements can range between 4 and 15 or more in a single electronic device. If, for instance, an electronic device includes three antenna arrays each having four antenna elements, the electronic device may include a dozen total antenna elements and therefore a dozen corresponding component chains. Consequently, an impact resulting from each individual physical component, such as a negative effect caused by any individual physical component, of a component chain is multiplied by a total quantity of antenna elements included in the electronic device. Examples of negative effects include a size occupied by an individual physical component, a power usage of the component, or a loss of signal strength imparted to a signal being processed by the component.

An example of an individual physical component that may be included in each component chain is a phase shifter. The phase shifter can adjust a phase of a version of a wireless signal relative to other versions of the wireless signal to enable beamforming for mmWave and other frequencies of wireless communications, including ones below mmWave such as those used by Wi-Fi 6. A phase shifter can be constructed using, for example, a signal phase generator and a vector modulator. In some implementations, the signal phase generator converts a signal having one phase to a split signal having at least two phases to produce at least two phase components of the signal. In such scenarios, two phase components of a split signal can be separated by ninety degrees (90°), such as by having 0° and 90° phases or 180° and 270° phases. This type of split signal that includes two components having different phases that are separated by 90° can be referred to as having an in-phase signal component (I signal component, I phase component, or I signal) and a quadrature signal component (Q signal component, Q phase component, or Q signal). The vector modulator of the phase shifter adjusts relative amplitudes of the components of the split signal. After the phase shifter recombines the components of the split signal, the relative amplitude adjustment can effectively change a phase of the version of the wireless signal flowing through the corresponding component chain to realize phase shifting in support of antenna beamforming. As described below, phase shifters can be implemented in various parts of an electronic device.

Phase shifters can be implemented fully or partially in a passive or active manner. Certain passive phase shifters can be used to achieve about three bits of resolution, with the quantity of bits of resolution determining a granularity of the phase-shift amounts. The quantity of bits in such passive phase shifters may be limited due to the large size of, and appreciable attenuation caused by, the passive components (e.g., resistors, capacitors, and/or inductors) and the switches that form the passive phase shifter. Certain active phase shifters, on the other hand, can enable a higher bit resolution for a finer phase-shift granularity. Instead of being limited to 45° phase-shift increments as with a three-bit phase shifter, 22.5° and 11.25° phase-shift increments can be achieved with four- and five-bit phase shifters, respectively. This enables a signal beam to be more finely aimed using a, e.g., five-bit active phase shifter. Some active phase shifters can be partially passive. For example, an active phase shifter can employ an active vector modulator for amplitude adjustment of the split signals. Such an active vector modulator can be implemented using one or more amplifiers. On the other hand, these active phase shifters can employ a passive circuit structure to generate the in-phase and quadrature (IQ) signal components that are adjusted by the vector modulator for the phase shifting.

Thus, a phase shifter, whether active or passive overall, can employ a passive signal phase generator to generate two or more phase components from a signal having at least one phase component. An example of a passive signal phase generator is a quadrature all-pass filter (QAF). A QAF can include at least one capacitive branch and at least one inductive branch. In some implementations, a QAF includes at least four branches: two inductive branches and two capacitive branches. Each inductive branch includes at least one inductor, and each capacitive branch includes at least one capacitor. Each QAF branch extends from an input of the QAF to an output of the QAF. Two of the four branches are cross-coupled with each other with respect to signal phases at the input and signal phases at the output of the QAF.

Generally, a QAF accepts a signal with at least one phase and generates one or more phases of the signal to thereby produce a split signal. For example, with differential signaling, a QAF accepts a differential signal with two phases and outputs a split signal having four phases. In terms of I and Q signal components, responsive to accepting an I signal component at an input of the QAF, the QAF generates an I signal component and a Q signal component such that the I and Q signal components are separated in phase by 90°. With differential signaling, the QAF can accept a plus I (I+) signal component and a minus I (I−) signal component and generate an I+ signal component, an I− signal component, a plus Q (Q+) signal component, and a minus Q (Q−) signal component. The I+, I−, Q+, and Q− signal components can respectively correspond to 0, 180, 90, and 270 degree phases.

The signaling output by the QAF is coupled to an input of the vector modulator. The input of the vector modulator, however, can capacitively load the output of the QAF. This can produce negative side effects. For example, with the capacitive loading on the QAF, the I and Q signal components output by the QAF can have an unbalanced amplitude. This unbalanced amplitude can result in erroneous vector modulation and therefore produce an incorrectly phase-shifted signal at the output of the phase shifter. This may prevent accurate beamforming, for example, or hinder other operations that use a phase-shifted signal. To account for this potential for an unbalanced output at the QAF due to capacitive loading by the input of the vector modulator, a matching circuit can be placed between the output of the QAF and the input of the vector modulator.

A matching circuit that uses, for example, at least one inductor per signal component can be employed to provide matching and account for the capacitive loading to at least partially counteract the potential for unbalanced amplitudes between the signal phase generator and the vector modulator. This matching circuit can include at least four inductors in differential signaling environments to handle the plus and minus parts of both the I and Q signal components. Unfortunately, inductors occupy a significant area of a radio-frequency (RF) integrated circuit (IC). Generally, smaller RF ICs can enable the production of smaller and less expensive devices. Accordingly, electronic devices can be made less expensive by avoiding usage of inductors. Further, a benefit of avoiding inductor usage in a phase shifter is multiplied by a quantity of antenna elements deployed in each electronic device. Accordingly, phase shift circuitry can be smaller, and the corresponding electronic device can be less expensive, if a coupling circuit were to exclude the inductors.

Instead of relying on a matching circuit having at least one inductor per signal component that is output by a QAF, described implementations employ a capacitor per signal component of a QAF to realize a compensation circuit. The compensation circuit couples a vector modulator to a signal phase generator that is implemented with a QAF. The compensation circuit compensates for capacitive loading on the QAF to counteract an amplitude imbalance that would otherwise be present in the I and Q signal components output by the QAF. Each respective capacitor of the compensation circuit is coupled between a respective output node of the QAF for one of the multiple signal components and at least one input of a vector modulator that is to accept the multiple signal components. To appreciably remediate the potential amplitude imbalance of the signal components output by the QAF, capacitive values of the capacitors of the compensation circuit may not be equivalent for all of the capacitors. Different capacitive values may counteract the potential different amplitudes of the various signal components that would otherwise be caused by the capacitive loading of the vector modulator. The difference between the capacitive values is greater than would be expected due to a variability in manufacturing or due to transient environmental conditions (e.g., dissimilar or changing temperatures).

In example implementations, a compensation circuit of a phase shifter includes four capacitors for differential signaling. Two capacitors are coupled to the two capacitive branches, and two other capacitors are coupled to the two inductive branches. The two capacitors that are coupled to the two capacitive branches have a different capacitance as compared to the two capacitors that are coupled to the two inductive branches. For example, the two capacitors that are coupled to the two capacitive branches of the QAF can be larger than the two capacitors that are coupled to the two inductive branches of the QAF. A ratio of capacitive values between larger and smaller capacitances of the capacitors of the compensation circuit can be greater than approximately two. Alternatively, the capacitive ratio can be greater than approximately three. Additionally or alternatively, the capacitive ratio can range between, for instance, approximately two and five (e.g., a ratio can be approximately three).

Using capacitors with unbalanced capacitive values in a compensation circuit reduces an area occupied by each phase shifter as compared to a phase shifter that relies on inductors for coupling between a QAF and a vector modulator. The reduced area conserves space within, and can decrease a cost of, an electronic device. These benefits grow as a quantity of antenna elements within the electronic device increases. The use of a QAF for phase generation also enables a higher bit resolution as compared to some other passive signal phase generators.

Further, an example amplifier is described for the vector modulator of the phase shifter. The amplifier can be configured as, for instance, a common-source (CS) amplifier (e.g., using complementary metal-oxide-semiconductor (CMOS) technology) and coupled to a QAF-based signal phase generator via a compensation circuit having multiple capacitors. The capacitor-based compensation circuit enables the amplifier to be implemented in a CS configuration, which can lower power consumption and further reduce an area occupied by beamforming circuitry. A QAF-based signal phase generator in conjunction with described implementations of a compensation circuit may be relatively insensitive to inductor and capacitor Q. Further, such a QAF and compensation circuit may also operate with a high bandwidth (e.g., a 20 GHz bandwidth or greater). Additionally, the quadrature phases may be generated consistently over a wide frequency range.

FIG. 1 illustrates an example environment 100 that includes an electronic device 102 having a wireless interface device 120 with a radio-frequency (RF) front-end 128 (RFFE 128). As shown, the RF front-end 128 includes a phase shifter 130. A phase shifter 130 as described herein can, however, be deployed in alternative or additional parts of an electronic device. The phase shifter 130 includes a signal phase generator 132, a vector modulator 134, and a compensation circuit 136, which are described below. In the environment 100, the example electronic device 102 communicates with a base station 104 through a wireless link 106. In FIG. 1, the electronic device 102 is depicted as a smartphone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or a smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project (3GPP) standard, such as a Long-Term Evolution (LTE), a 4th Generation (4G), or a 5th Generation (5G) cellular standard; an IEEE 802.11 standard, such as an 802.11g, ac, ax, ad, aj, or ay standard, including Wi-Fi 6; an IEEE 802.16 standard (e.g., WiMAX™); a Bluetooth™ standard; and so forth. In some implementations, the wireless link 106 may wirelessly provide power, and the electronic device 102 or the base station 104 may comprise a power source.

As shown, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and/or other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera or other sensor ports, and so forth. The display 118 can be realized as a display screen or a projection that presents one or more graphical images provided by the electronic device 102, such as a user interface associated with an operating system, program, or application. Alternatively or additionally, the display 118 may be implemented as a display port or virtual interface through which graphical content of the electronic device 102 is communicated or presented.

As illustrated, the electronic device 102 further includes at least one wireless interface device 120 and at least one antenna array 122. In other implementations, such as those in which a phase shifter 130 does not support beamforming operations, the antenna array 122 may be omitted or may be replaced with a non-arrayed antenna. The wireless interface device 120 provides connectivity to respective networks and peer devices via a wireless link, which may be configured similar to or differently from the wireless link 106. Alternatively or additionally, the electronic device 102 may include a wired interface device (not shown), such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. However, the electronic device 102 may also or instead communicate directly with other peer devices, an alternative wireless network, and the like.

As shown for this example, the wireless interface device 120 includes at least one communication processor 124, at least one transceiver 126, and at least one RF front-end 128 (RFFE 128). These components process data information, control information, and signals associated with communicating information for the electronic device 102 via the antenna array 122 or another antenna. The communication processor 124 may be implemented as at least part of a system-on-chip (SoC), a modem baseband processor, or a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and/or other components of the wireless interface device 120 to implement various communication protocols or communication techniques.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118, to enable control of, or other interaction with, the other components of the electronic device 102. Thus, an operative coupling between two or more components can enable the operatively coupled components to perform a function or operate as described herein. The communication processor 124 may also include a memory (not separately shown), such as a CRM 110, to store data and/or processor-executable instructions (e.g., code).

The various components illustrated in the drawings, including in FIG. 1, using separate schematic blocks are done so by way of example only and may instead be manufactured or packaged in different discrete manners. For example, one physical module may include components of the RF front-end 128 and some components of the transceiver 126, and another physical module may combine the communication processor 124 with the remaining components of the transceiver 126. Additionally, at least one antenna array 122 may be co-packaged with at least some components of an RF front-end 128 to form an antenna module. Further, an electronic device 102 may include multiple such antenna modules, thereby spatially distributing various physical components of at least one RF front-end 128 within a housing of the electronic device 102.

The transceiver 126 can include circuitry or logic for filtering, amplification, channelization, frequency translation, and so forth. The frequency translation may include an up-conversion or a down-conversion of frequency that is performed in a single conversion operation (e.g., a direct-conversion architecture) or through multiple conversion operations (e.g., a superheterodyne architecture). The transceiver 126 can include filters, amplifiers, switches, mixers, and so forth for routing and conditioning signals that are transmitted or received via the antenna array 122. Although not explicitly shown, the wireless interface device 120 can also include a digital-to-analog converter (DAC) or an analog-to-digital converter (ADC) to convert between analog signals and digital signals. A DAC or an ADC can be implemented as part of the communication processor 124, as part of the transceiver 126, or separately from both of them.

The components or circuitry of the transceiver 126 or the RF front-end 128 can be implemented in any suitable fashion. For example, the transceiver 126 can be implemented as combined transceiver logic or separately as respective transmitter and receiver entities. In some cases, the transceiver 126 or the RF front-end 128 is implemented with multiple or different sections to implement respective transmitting and receiving operations (e.g., separate transmit and receive chains, respectively). The transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals to be transmitted via the antenna array 122 or signals being received via the antenna array 122, or another antenna. As shown for this example embodiment, the RF front-end 128 includes at least one phase shifter 130 (PS 130). The RF front-end 128 may also include other RF sensors and components, such as a peak detector, power meter, gain control block, antenna tuning circuit, N-plexer, balun, and the like. Configurable components of the RF front-end 128, such as the phase shifter 130, may be controlled by the communication processor 124 to implement communications in various modes, with different frequency bands, or using antenna beamforming.

Although the phase shifter 130 is depicted as being part of the RF front-end 128, described implementations of a phase shifter 130 can alternatively be employed in other portions of the wireless interface device 120 (e.g., in the transceiver 126) or in other portions of the electronic device 102 generally. The described phase shifter 130 can be implemented wherever a signal is to experience a controlled phase change or phase correction. For example, a phase shifter 130 can be coupled to a mixer for local oscillator phase shifting. The mixer and phase shifter can be part of, for example, a transceiver or an RF front-end.

In example implementations, the phase shifter 130 includes at least one signal phase generator 132, at least one vector modulator 134, and at least one compensation circuit 136. The signal phase generator 132 changes a quantity of phases of a signal, such as by generating at least one phase to increase a quantity of phases. For instance, a signal phase generator 132 can produce I and Q phase components (e.g., with two phases for single-ended signaling or four phases for differential signaling) from an I phase component (e.g., with one phase for single-ended signaling or two phases for differential signaling). The vector modulator 134 modulates at least one amplitude of one or more components of a signal traversing circuitry of the vector modulator 134. The modulation, or amplitude adjustment, can include increasing amplitude (e.g., positive amplification, amplification by a gain that is greater than one, or an amplification) or decreasing amplitude (e.g., negative amplification, amplification by a gain between zero and one, or an attenuation) of a component of a signal.

As shown, the compensation circuit 136 is coupled between the signal phase generator 132 and the vector modulator 134. For example, the compensation circuit 136 can be coupled between an output of the signal phase generator 132 and an input of the vector modulator 134. In operation, absent the compensation circuit 136, a capacitance of the vector modulator 134 can adversely impact an amplitude balance of phase components generated at the output of the signal phase generator 132. The compensation circuit 136 can, however, maintain amplitude balance at the output of the signal phase generator 132 using unbalanced circuit components. As described herein, the compensation circuit 136 can include multiple capacitors having at least two different capacitances to "restore" an amplitude balance of the phase components of a signal propagating through the phase shifter 130. Example implementations of the signal phase generator 132, the vector modulator 134, and the compensation circuit 136 are described herein below, starting with FIG. 4. Capacitors for the compensation circuit 136, which capacitors include unbalanced capacitances, are described starting with FIGS. 4 and 5.

In some implementations, the antenna array 122 is implemented as at least one antenna array that includes multiple antenna elements. Thus, as used herein, an "antenna" can refer to at least one antenna array or at least one antenna element, depending on context. To implement antenna beamforming, a respective phase shifter 130 can be coupled to each respective antenna element of the antenna array 122, which is described below with reference to FIGS. 3-1 to 3-3. Additional aspects of both the wireless interface device 120 and the antenna array 122 in terms of antenna beamforming are described next with reference to FIG. 2.

Figure 2:
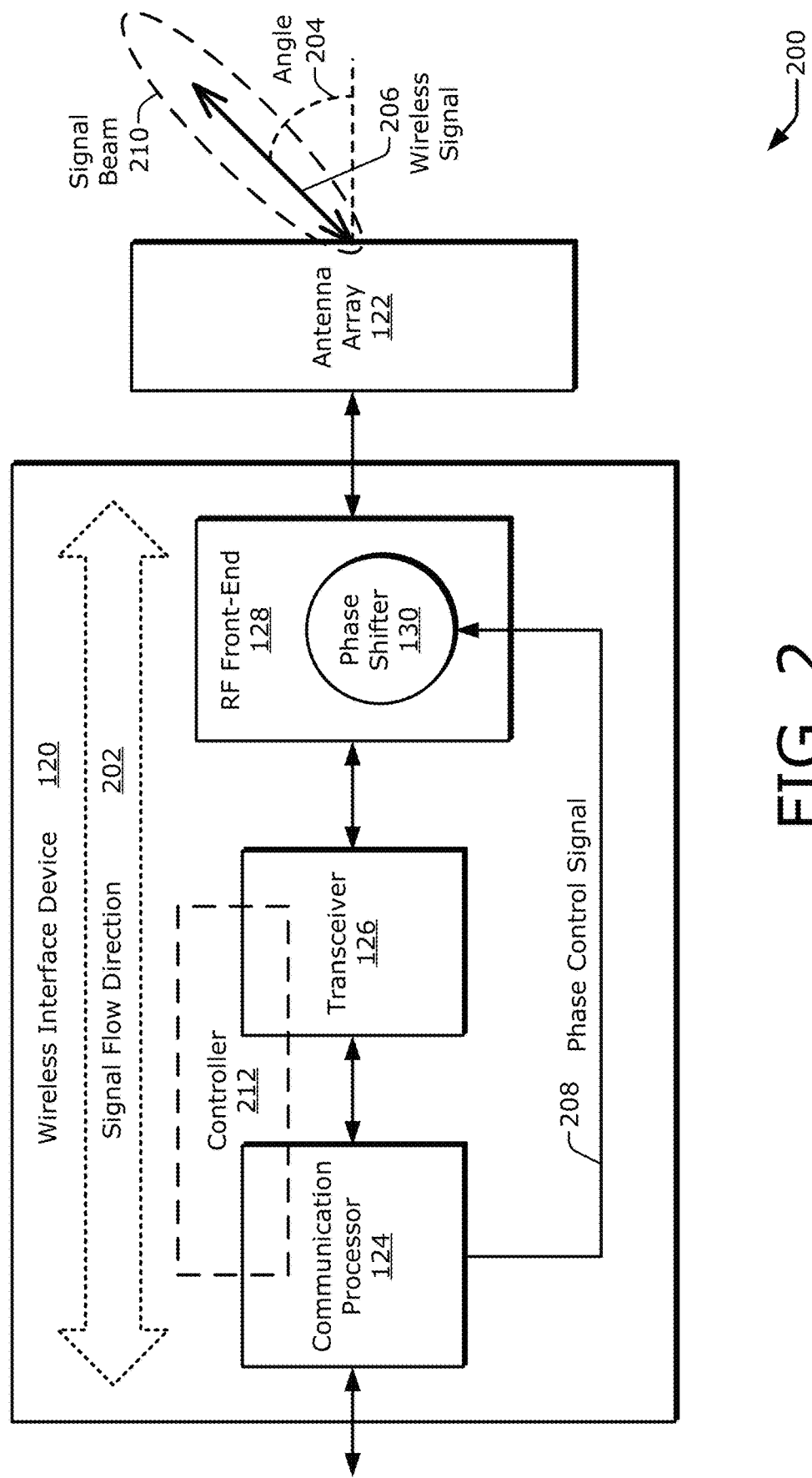
FIG. 2 illustrates an antenna array coupled to an example wireless interface device that includes a communication processor and an RF front-end (RFFE) with at least one phase shifter.

FIG. 2 illustrates at 200 generally the antenna array 122 coupled to an example implementation of the wireless interface device 120, which includes the communication processor 124 and the RF front-end 128. An example signal flow direction 202 is depicted bidirectionally. Thus, signals can flow in both directions across the wireless interface device 120 to accommodate both transmission and reception signals. As shown, the communication processor 124 is coupled to the transceiver 126, and the transceiver 126 is coupled to the RF front-end 128, which includes at least one phase shifter 130. Although not explicitly shown, the communication processor 124 can be coupled to other components of the electronic device 102 of FIG. 1, such as the application processor 108, the CRM 110, and/or the display 118.

In operation, the antenna array 122 emanates for transmission or senses for reception at least one wireless signal 206. With antenna beamforming, the wireless signal 206 can be transmitted or received via at least one signal beam 210. Using beamsteering, the wireless signal 206 can therefore be transmitted or received relative to at least one angle 204 to provide for wireless communication directionality. To steer the signal beam 210 of the wireless signal 206, the phase shifter 130 of the RF front-end 128 shifts a phase of a version of a signal propagating through the phase shifter 130, with the propagating signal previously received as the wireless signal 206 or being conditioned for transmission as the wireless signal 206.

An amount of a phase shift produced by the phase shifter 130 can be controlled by the communication processor 124 using at least one phase control signal 208. The communication processor 124 can generate the phase control signal 208 responsive to beamforming parameters indicative of a targeted angle 204 or a targeted number of degrees of a phase shift. Alternatively, the transceiver 126 can generate or provide the phase control signal 208. More generally, a controller 212 that is part of at least one of the communication processor 124 or the transceiver 126 can generate or provide the phase control signal 208. The phase control signal 208 can be implemented, for instance, as a digital signal including one or more bits. Example approaches for controlling the phase shifter are described further herein below.

Figures 1, 3:
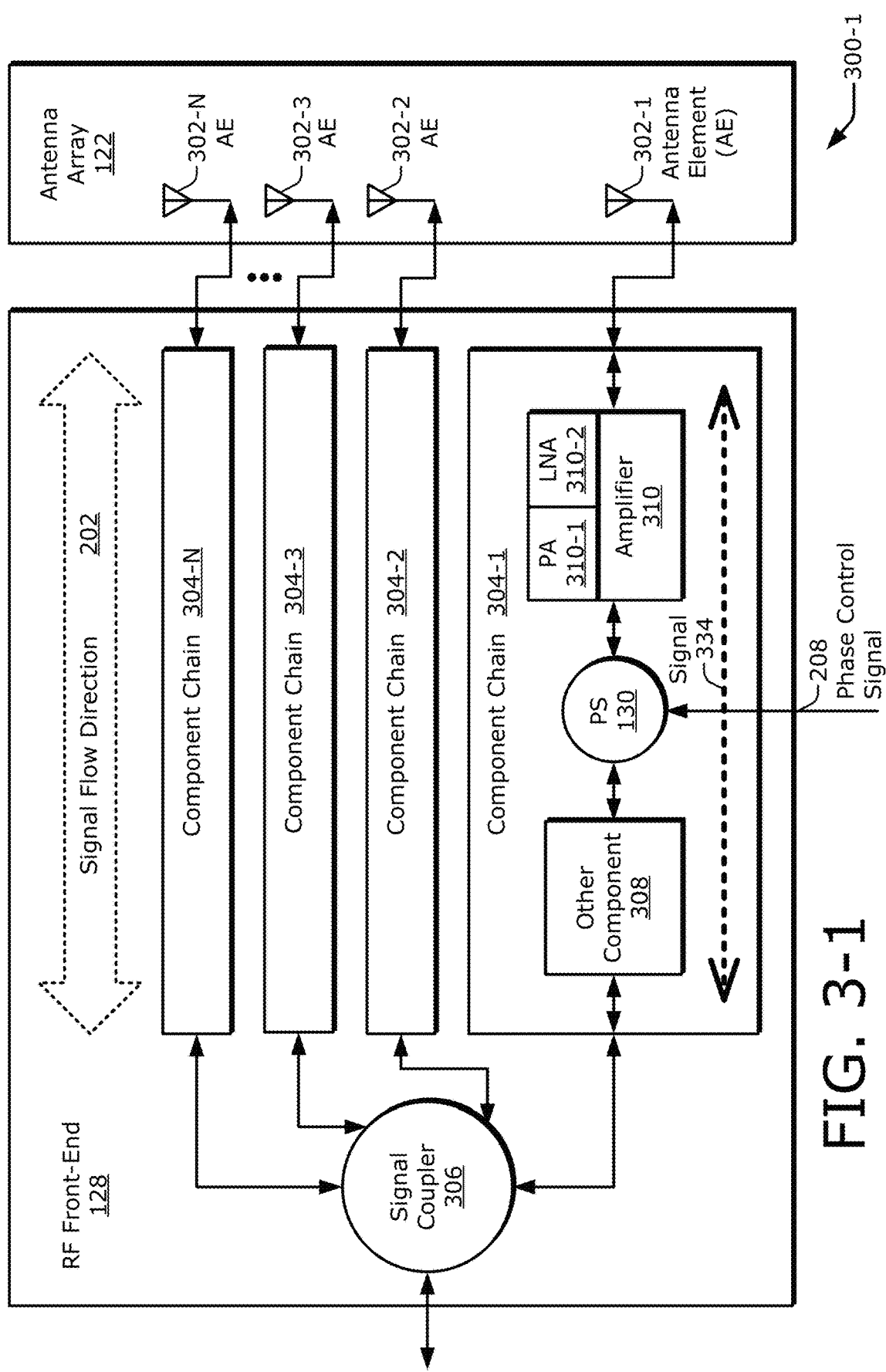
Figures 2, 3:
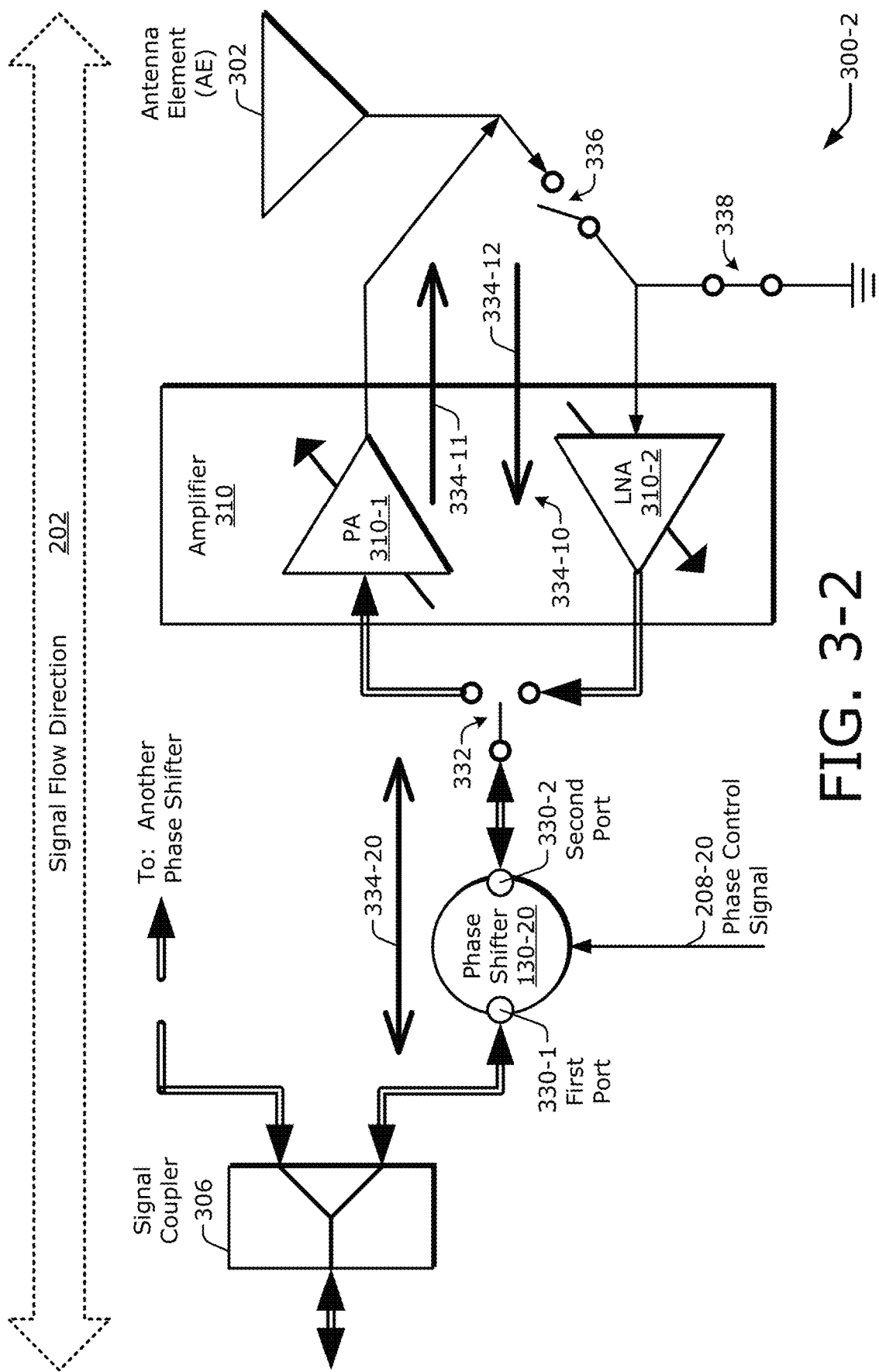
Figure 3:
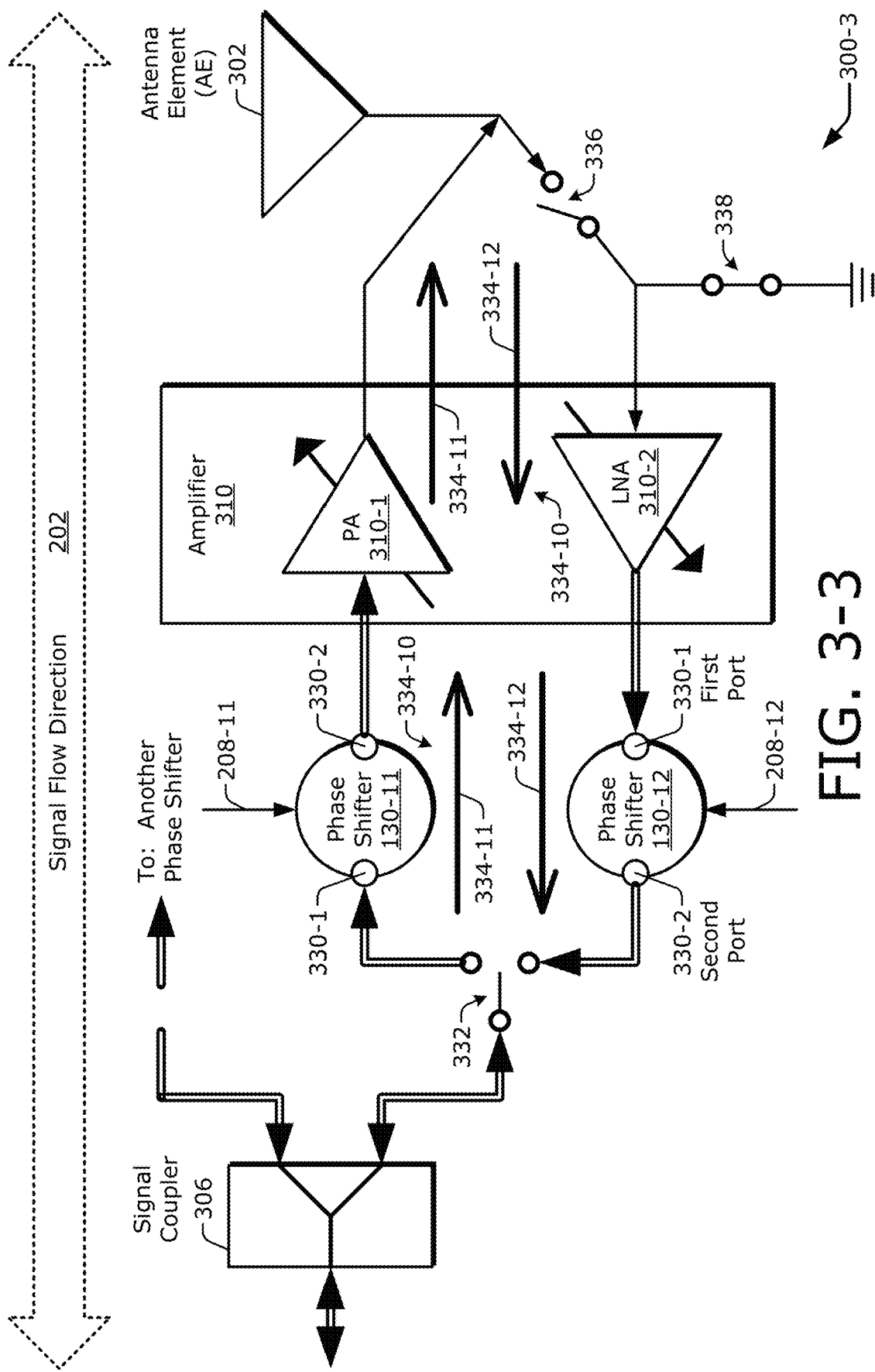

FIG. 3-1 illustrates generally at 300-1 the antenna array 122 being coupled to an example implementation of the RF front-end 128. The RF front-end 128 includes multiple component chains 304-1, 304-2, 304-3, . . . , 304-N, with "N" representing a positive integer (e.g., two or more for beamforming). Here, each component chain 304 includes at least one phase shifter 130 (PS 130). The antenna array 122 includes multiple antenna elements 302-1, 302-2, 302-3, . .

. . , 302-N, with "N" representing a positive integer (e.g., two or more for beamforming). The values for the variable "N" may be the same or different. Each respective antenna element 302 (AE 302) of the multiple antenna elements 302-1 . . . 302-N is coupled to a respective component chain 304 of the multiple component chains 304-1 . . . 304-N. For example, a first component chain 304-1 is coupled to a first antenna element 302-1, and a second component chain 304-2 is coupled to a second antenna element 302-2.

In example implementations, each component chain 304 of the multiple component chains 304-1 . . . 304-N is coupled to a signal coupler 306. The signal coupler 306 can function as a combiner/splitter. For example, the signal coupler 306 can combine multiple signal versions accepted from the multiple component chains 304-1 . . . 304-N into a combined signal for a receiving operation. The signal coupler 306 can also split a signal into multiple signal versions and provide the versions to the multiple component chains 304-1 . . . 304-N for a transmitting operation.

As illustrated, each respective component chain 304 respectively includes at least one phase shifter 130 (PS 130), at least one amplifier 310, and at least one other component 308. However, a given component chain 304 can include more, fewer, or different physical components. The signal flow direction 202 along each component chain 304 can be bidirectional as indicated by the double-headed arrow. As shown, these physical components of a respective component chain 304 are coupled together in series between the signal coupler 306 and the respective corresponding antenna element 302 of the antenna array 122. The other component 308 is nearest the signal coupler 306, and the amplifier 310 is nearest the antenna element 302. The phase shifter 130 is therefore coupled between the other component 308 and the amplifier 310. However, the order of these physical components along a given component chain 304 may differ.

The other component 308 can be realized as a filter, another amplifier, a mixer, a switch, and so forth. The amplifier 310 can be implemented in different manners. For example, the amplifier 310 can be implemented as a power amplifier (PA) 310-1 (PA 310-1) for transmission operations or as a low-noise amplifier (LNA) 310-2 (LNA 310-2) for reception operations. The phase shifter 130 can therefore provide a phase-shifted signal to the PA 310-1 for amplification and forwarding to the corresponding antenna element 302 for emanation therefrom. The phase shifter 130 can also or instead accept an amplified signal from the LNA 310-2 for phase shifting and then forwarding to the other component 308, or for forwarding "directly" to the signal coupler 306 if no other component 308 is present.

In example operations, each respective component chain 304 adjusts or conditions a signal propagating between the signal coupler 306 and a respective antenna element 302. Thus, each respective component chain 304 modifies a signal version to produce a respective signal version having a different respective phase or amplitude that is appropriate for providing to or accepting from a respective antenna element 302 to support a beamsteering operation. The phase shifter 130 performs phase shifting operations based on the phase control signal 208.

In FIG. 3-1, a signal 334 is depicted with regard to the component chain 304-1. The signal 334 can propagate along the component chain 304-1 between the signal coupler 306 and the antenna element 302-1. Other such signals can be propagating through other component chains. As represented by the dashed appearance of the arrow representing the signal 334, the signal 334 can be realized as a bidirectional signal, a unidirectional signal, or a combination thereof as the signal 334 traverses different parts of the component chain 304. A bidirectional implementation of the signal 334 as it traverses one phase shifter is described with reference to FIG. 3-2, and unidirectional implementations of the signal 334 as they traverse across two phase shifters are described with reference to FIG. 3-3.

FIG. 3-2 illustrates generally at example circuitry 300-2 an antenna element 302 coupled to a portion of a component chain 304 (e.g., of FIG. 3-1), which includes a phase shifter 130-20 that can be operated bidirectionally. As illustrated, the bidirectional phase shifter 130-20 includes multiple ports: a first port 330-1 and a second port 330-2. The bidirectional phase shifter 130-20 is coupled to the signal coupler 306 via the first port 330-1 and to the amplifier 310 via the second port 330-2. However, the orientation of the bidirectional phase shifter 130-20 can be flipped such that the first port 330-1 is positioned closer to the antenna element 302 and the second port 330-2 couples the bidirectional phase shifter 130-20 to the signal coupler 306. A phase-shift amount for the bidirectional phase shifter 130-20 is set responsive to the phase control signal 208-20.

At least one switch 332 switchably couples the bidirectional phase shifter 130-20 to the amplifier 310. With a one-pole, two-throw implementation, the switch 332 includes a pole, which is coupled to the second port 330-2, and two throws: a top throw and a bottom throw. The switch 332 can selectively connect the second port 330-2 of the bidirectional phase shifter 130-20 to an input of the PA 310-1 via the top throw or to an output of the LNA 310-2 via the bottom throw.

An output of the PA 310-1 is coupled to the antenna element 302. An input of the LNA 310-2 is coupled to the antenna element 302. At least one switch 336 can selectively disconnect the PA 310-1 and/or the LNA 310-2—in FIG. 3-2, the switch 336 is coupled between the antenna 302 and the input of the LNA 310-2, but other configurations are possible—from the antenna 302. At least one switch 338 can couple the input of the LNA 310-2 to a ground. As depicted in FIG. 3-2, the switches 336 and 338 are in an open state and a closed state, respectively, to enable a transmission operation. The switch 336 can be closed, and the switch 338 can be opened to enable a reception operation. However, a different quantity or arrangement of switches can be implemented to couple the various physical components of the component chain to each other or to the antenna element 302.

In FIGS. 3-2 and 3-3, lines interconnecting different physical components can represent a quantity of wires. Thus, a double line can represent two wires, and a single line can represent one wire. In some cases, a differential signal is propagated over the double lines, and a single-ended signal is propagated over the single lines. As shown in FIGS. 3-2 and 3-3, differential signals can be propagated to the left of—or on the processor side of—the amplifier 310. In contrast, single-ended signals can be propagated to the right of—or on the antenna side of—the amplifier 310. The singled-ended signaling and the differential signaling can, however, be implemented differently. For example, one or more of the antennas 302 can be fed with a differential signal, for example when those antennas are configured as dipoles.

In some implementations, a bidirectional signal 334-20 traverses the bidirectional phase shifter 130-20. An example of this approach is depicted in FIG. 3-2. The bidirectional signal 334-20 propagates between the signal coupler 306 and the amplifier 310 and thus through the bidirectional phase shifter 130-20. The bidirectional phase shifter 130-20 can therefore be used for both transmit and receive operations. FIG. 3-2 also depicts at least one unidirectional signal 334-10 propagating between the amplifier 310 and the antenna element 302. Specifically, a unidirectional transmission signal 334-11 propagates from the PA 310-1 to the antenna element 302. And a unidirectional reception signal 334-12 propagates from the antenna element 302 to the LNA 310-2.

FIG. 3-3 illustrates generally at example circuitry 300-3 an antenna element 302 coupled to a portion of a component chain 304 (e.g., of FIG. 3-1). The portion includes two phase shifters 130-11 and 130-12 that can each be operated unidirectionally. The circuitry 300-3 is similar to the circuitry 300-2 of FIG. 3-2 except that two unidirectional phase shifters are employed in the circuitry 300-3 instead of one bidirectional phase shifter like in the circuitry 300-2. In operation, a first phase control signal 208-11 establishes a first phase-shift setting for one unidirectional phase shifter 130-11 that is part of a transmit path. A second phase control signal 208-12 establishes a second phase-shift setting for another unidirectional phase shifter 130-12 that is part of a receive path.

As illustrated, each of the two unidirectional phase shifters 130-11 and 130-12 includes multiple ports: a first port 330-1 and a second port 330-2. The unidirectional phase shifter 130-11 is coupled to the signal coupler 306 via the first port 330-1 thereof and to the amplifier 310 via the second port 330-2. The unidirectional phase shifter 130-12 is coupled to the amplifier 310 via the first port 330-1 thereof and to the signal coupler 306 via the second port 330-2. However, the orientation of either or both unidirectional phase shifters 130-11 or 130-12 can be flipped such that positions of the first port 330-1 and the second port 330-2 are swapped. Thus, in some implementations a unidirectional phase shifter accepts a signal via the first port 330-1 and provides a phase-shifted signal via the second port 330-2. In other implementations, a unidirectional phase shifter accepts a signal via the second port 330-2 and provides a phase-shifted signal via the first port 330-1.

At least one switch 332 switchably couples the two unidirectional phase shifters 130-11 and 130-12 to the signal coupler 306. For a one-pole, two-throw implementation, the switch 332 includes a pole, which is coupled to the signal coupler 306, and two throws: a top throw and a bottom throw. The switch 332 can selectively connect the signal coupler 306 to the first port 330-1 of the unidirectional phase shifter 130-11 via the top throw or connect the signal coupler 306 to the second port 330-2 of the unidirectional phase shifter 130-12 via the bottom throw. The second port 330-2 of the unidirectional phase shifter 130-11 is coupled to an input of the PA 310-1. An output of the PA 310-1 is coupled to the antenna element 302. The antenna element 302 is coupled to an input of the LNA 310-2. An output of the LNA 310-2 is coupled to the first port 330-1 of the unidirectional phase shifter 130-12. The switches 332, 336, and 338 can operate in terms of transmission and reception operations as described above with reference to FIG. 3-2. However, a different quantity or arrangement of switches can be implemented to couple the various physical components of the illustrated portion of a component chain to each other or to the antenna element 302.

In some implementations, at least one unidirectional signal 334-10 propagates through the illustrated physical components. As shown, two unidirectional signals 334-11 and 334-12 traverse the two unidirectional phase shifters 130-11 and 130-12, respectively. A unidirectional transmit signal 334-11 propagates between the switch 332 and the PA 310-1 and thus through the unidirectional phase shifter 130-11. The unidirectional phase shifter 130-11 can therefore be used for transmit operations. The unidirectional transmission signal 334-11 also propagates between the PA 310-1 and the antenna element 302. A unidirectional reception signal 334-12 propagates between the antenna element 302 and the LNA 310-2. The unidirectional reception signal 334-12 also propagates between the LNA 310-2 and the switch 332 and thus through the unidirectional phase shifter 130-12. The unidirectional phase shifter 130-12 can therefore be used for receive operations.

Figure 4:
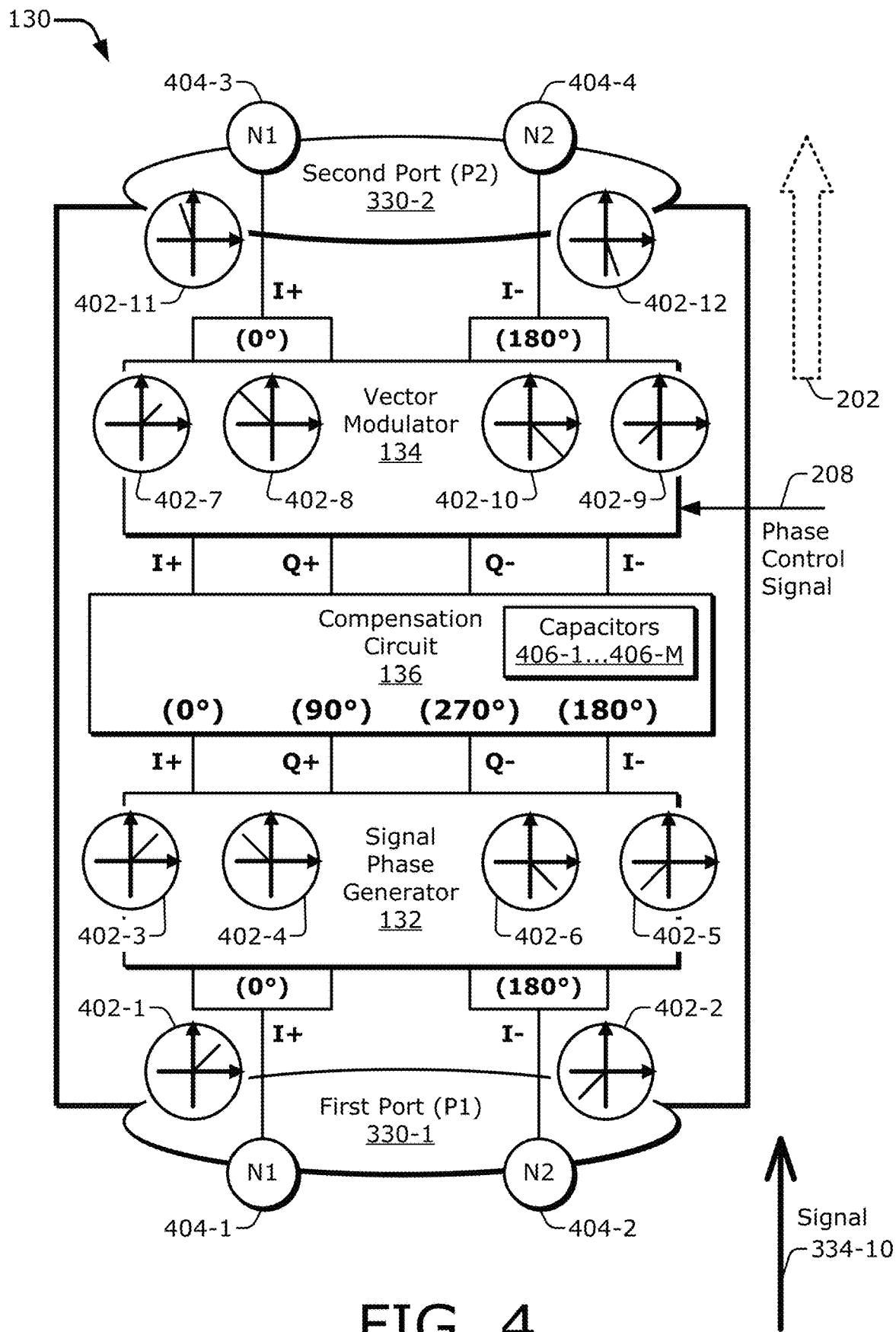
FIG. 4 illustrates an example phase shifter including a signal phase generator, a compensation circuit, and a vector modulator with depictions of multiple phases of multiple signal components using phasor diagrams.

FIG. 4 illustrates an example phase shifter 130 including a signal phase generator 132, a compensation circuit 136, and a vector modulator 134. FIG. 4 also depicts multiple phasors 402-1 . . . 402-12 to represent phases of multiple signal components using phasor diagrams. The phase shifter 130 includes multiple ports, a first port 330-1 (P1) and a second port 330-2 (P2), that enable the phase shifter 130 to couple to other components of a component chain 304 as described above with reference to FIGS. 3-1 to 3-3. The phase shifter 130 is illustrated, by way of example, in a differential signaling configuration.

As shown, the first port 330-1 is coupled to the signal phase generator 132, and the second port 330-2 is coupled to the vector modulator 134. The signal phase generator 132 is coupled to the vector modulator 134 via the compensation circuit 136. Thus, the compensation circuit 136 can be disposed electrically between the signal phase generator 132 and the vector modulator 134. The compensation circuit 136 includes multiple capacitors 406-1 . . . 406-M, with "M" representing a positive integer. The phase shifter 130 includes multiple nodes 404-1, 404-2, 404-3, and 404-4 for signal input and output. Although four nodes 404-1 to 404-4 are explicitly depicted in FIG. 4, a phase shifter 130 can include more or fewer nodes. For example, additional nodes are depicted in FIG. 6 and described herein below.

Figure 6:
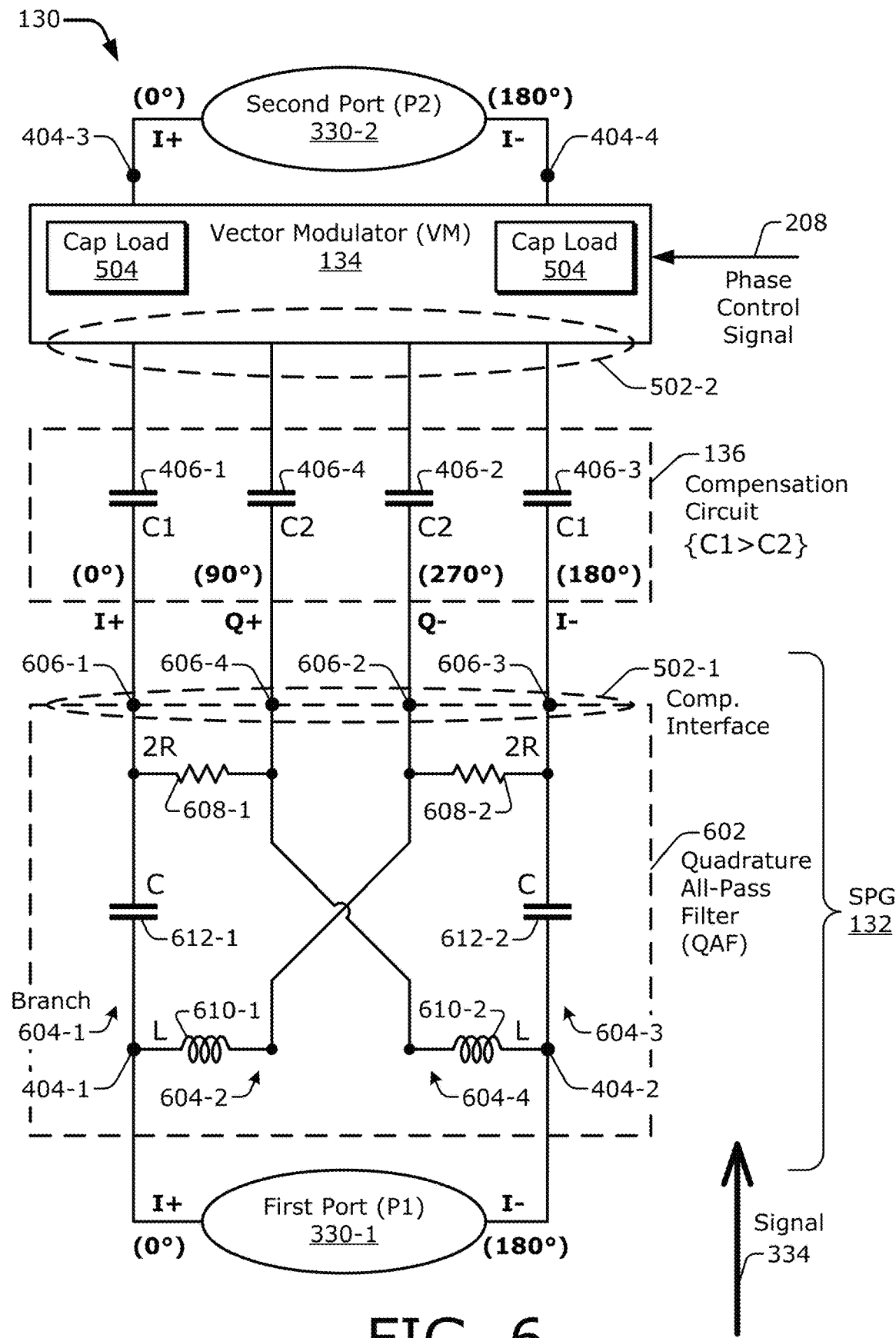
FIG. 6 illustrates an example phase shifter including a vector modulator, a compensation circuit with multiple capacitors, and a signal phase generator implemented with an example quadrature all-pass filter (QAF).

In example implementations, the first port 330-1 includes one or more nodes, the second port 330-2 includes one or more nodes, and the compensation circuit 136 includes two or more nodes (e.g., as explicitly shown in FIG. 6). In a single-ended signaling environment, the first and second ports 330-1 and 330-2 can each include one node, and the compensation circuit 136 can include two nodes. In a differential signaling environment, the first and second ports 330-1 and 330-2 can each include two nodes, and the compensation circuit 136 can include four nodes (e.g., as explicitly shown in FIG. 6). By way of example, the phase shifter 130 that is depicted in FIG. 4 can shift a phase of a differential signal that propagates between the first port 330-1 and the second port 330-2.

Accordingly, the first port 330-1 includes two nodes N1 and N2: a first node 404-1 and a second node 404-2, respectively. The second port 330-2 also includes two nodes N1 and N2: a third node 404-3 and a fourth node 404-4, respectively. As shown, the two nodes N1 and N2 of both the first and second ports 330-1 and 330-2 can respectively represent a plus node and a minus node. The two nodes N1 and N2 can also respectively correspond to a differential signal having phases of zero (0) degrees and 180 degrees (e.g., an I+ signal component and an I− signal component, respectively). Between the signal phase generator 132 and the vector modulator 134, four pathways of the compensation circuit 136 can correspond to two differential signals having phases of 0, 90, 270, and 180 degrees (e.g., I+, Q+, Q−, and I− signal components, respectively), which are depicted from left to right in the example of FIG. 4.

The phase shifter 130 of FIG. 4 is described with a unidirectional signal 334-10. Here, the phase shifter 130 accepts the unidirectional signal 334-10 at the first port 330-1 and provides a phase-shifted version of the unidirectional signal 334-10 at the second port 330-2. Thus, the illustrated phasors 402 are applicable to operation along a signal flow direction 202 in which the signal phase generator 132 operates on the unidirectional signal 334-10 "before" the vector modulator 134. The phasors are different if a signal propagates from the second port 330-2 to the first port 330-1 and the vector modulator 134 operates on the propagating signal "before" the signal phase generator 132 does. However, the described principles are applicable to a phase shifter 130 that processes a unidirectional signal 334-10 that propagates from the second port 330-2 to the first port 330-1. The described principles are also applicable to a phase shifter 130 that is implemented in a bidirectional manner (e.g., as shown in FIG. 3-2). To do so, the vector modulator 134 can be implemented with bidirectional circuitry, such as with passive elements or a common gate (CG) amplifier arrangement. Further, although two and four signal components of the unidirectional signal 334-10 are illustrated in FIG. 4 at the first and second ports 330-1 and 330-2 and at the compensation circuit 136, respectively, a different quantity of signal components can alternatively be implemented.

In an example scenario for FIG. 4, the signal phase generator 132 operates on the unidirectional signal 334-10 before the vector modulator 134 along a signal flow direction 202 from the first port 330-1 to the second port 330-2. Initially, the phase shifter 130 accepts the unidirectional signal 334-10 at the first port 330-1. The unidirectional signal 334-10 includes two components. A first component of the unidirectional signal 334-10 propagates through the first node 404-1, and a second component propagates through the second node 404-2. At the first and second nodes 404-1 and 404-2, the first and second components of the unidirectional signal 334-10 have different phases, such as 0° and 180° for I+ and I− signal components, respectively.

The signal phase generator 132 generates at least one additional phase for at least one component of the unidirectional signal 334-10. For example, the signal phase generator 132 can generate two additional phases of 90° and 270° (e.g., for the Q+ and Q− signal components, respectively) from the 0° and 180° phases (e.g., for the I+ and I− signal components, respectively). The four signal phase components (e.g., I+, I−, Q+, and Q−) propagate from the signal phase generator 132, through the compensation circuit 136, and to the vector modulator 134 through, e.g., four pathways (not explicitly shown in FIG. 4). As described below with reference to FIG. 5, each pathway includes at least one capacitor 406 of the multiple capacitors 406-1 ... 406-M of the compensation circuit 136. Thus, the vector modulator 134 accepts the first through the fourth signal components from the signal phase generator 132 via the circuitry of the compensation circuit 136.

The vector modulator 134 adjusts at least one amplitude of the first through the fourth components of the unidirectional signal 334-10 responsive to the phase control signal 208. The vector modulator 134 produces four adjusted components of the unidirectional signal 334-10, and one or more of such components may have an adjusted amplitude. The four adjusted components, which are present at least internal to the vector modulator 134, can be "recombined" to produce two components while realizing a phase shift for the unidirectional signal 334-10. For example, I+ and Q+ signal components can be recombined to form an I+ signal component at the third node 404-3, and the I− and Q− signal components can be recombined to form an I− signal component at the fourth node 404-4. The phase shifter 130 can forward these recombined signal components as a version of the wireless signal 206 (of FIG. 2) for transmission via a respective antenna element or for combining with other signal versions as part of a reception operation.

The signal components propagating through the phase shifter 130 are described using particular symbols (e.g., I+, I−, Q+, Q−) and/or phases (e.g., 0°, 180°, 90°, and 270°) at different circuit locations. These symbols and phases are relative to other signal components at a given signal propagation position, such as at a particular port or at an interface of the compensation circuit 136. Nonetheless, the I+ and I− signal components at the first port 330-1 may be different from the I+ and I− signal components at the second port 330-2. Similarly, the I+ and I− signal components at the first port 330-1 may be different from the I+ and I− signal components at an input of the compensation circuit 136. In other words, the 0° indication for the phase of the I+ signal component at the first node 404-1 may not be identical to the 0° indication for the phase of the I+ component between the signal phase generator 132 and the compensation circuit 136. The indicated 0° at any given stage of the phase shifter 130 can establish a reference phase to which other phases at a given stage are relative. Thus, the I− component is 180° from the I+ component at the first port 330-1, and the Q+ component is 90° from the I+ component at the input of the compensation circuit 136. In this sense, the signal phase generator may "generate" a different 0° reference phase for the I+ component. The unidirectional signal 334-10 can remain, however, a differential signal at the second port 330-2 with a phase that is shifted relative to the differential signal at the first port 330-1 to support beamforming operations.

Examples of different phases in the phase shifter 130 are described next using graphically-depicted phasors. Multiple phases of multiple components of a unidirectional signal 334-10 are depicted via multiple phasors 402-1 ... 402-12. In an example scenario for FIG. 4, the signal phase generator 132 operates on the unidirectional signal 334-10 before the vector modulator 134 along a signal flow direction 202 from the first port 330-1 to the second port 330-2. To visually represent relative phases and magnitudes of the different signal components at various nodes, each phase of a signal component is depicted with a phasor diagram 402. Initially, the phase shifter 130 accepts the unidirectional signal 334-10 at the first port 330-1. At the first node 404-1, a corresponding signal component of the unidirectional signal 334-10 has a 45° phase as represented by a phasor 402-1. A phase of 45° is used in FIG. 4, by way of example only, so that the phase angles are not obscured by the axes of the phasor diagrams. With differential signaling, a corresponding signal component at the second node 404-2 has a 225° phase as represented by a phasor 402-2.

The signal phase generator 132 accepts the two signal components with 45° and 225° phases. The signal phase generator 132 generates two additional phases and spreads the four phases across four signal components. This distribution of the phases is depicted with phasors 402-3 to 402-6. The signal components with the four phases are separated by 90° increments. The signal phase generator 132 outputs the four components and provides them to the compensation circuit 136. Starting from the left and moving rightward along the signal phase generator 132, a first signal component has a 45° phase as represented by a phasor 402-3, and a second signal component has a 135° phase as represented by a phasor 402-4. A phase difference between the first and second signal components is therefore 90°. A fourth signal component has a 315° phase as represented by a phasor 402-6, and a third signal component has a 225° phase as represented by a phasor 402-5.

As indicated by the four phasors 402-3 to 402-6, amplitudes of the signal components of the unidirectional signal 334-10 that are output by the signal phase generator 132 can have substantially equal magnitudes due to the compensation circuit 136. The compensation circuit 136 accounts for capacitive loading of the vector modulator 134 to balance the magnitudes of the four components output by the signal phase generator 132. This is accomplished, at least in part, due to certain capacitors of the multiple capacitors 406-1 . . . 406-M of the compensation circuit 136 having unbalanced capacitive values, as is described herein. As noted above, the example numerical phase values illustrated at the input of the compensation circuit 136—e.g., 0°, 90°, 270°, and 180°—represent relative phase differences between the four signal components.

The compensation circuit 136 forwards the four signal components to the vector modulator 134. The vector modulator 134 adjusts an amplitude of at least one component of the unidirectional signal 334-10 responsive to the phase control signal 208. In this example, the vector modulator 134 decreases the amplitudes of the I+ and I− signal components propagating along the two "external" pathways. This is graphically represented with relatively shorter phasor arrows at a phasor 402-7 and a phasor 402-9, respectively. In contrast, the vector modulator 134 increases the amplitudes of the Q+ and Q− signal components propagating through the two "internal" pathways. This is graphically represented with relatively longer phasor arrows at a phasor 402-8 and a phasor 402-10, respectively.

The vector modulator 134 produces four components of the unidirectional signal 334-10 with the four components having the depicted amplitudes and phase angles at the four phasors 402-7 to 402-10. The phase shifter 130 "recombines" the signal components for outputting at the second port 330-2 as a differential signal. At the third node 404-3, after the amplitude adjustments by the vector modulator 134, the I+ and Q+ signal components are combined to produce another I+ signal component having a 110° phase as represented by a phasor 402-11. At the fourth node 404-4, after the amplitude adjustments by the vector modulator 134, the I− and Q− signal components are combined to produce another I− signal component having a 290° phase as represented by a phasor 402-12. In this manner, the phase shifter 130 can shift a phase of the unidirectional signal 334-10 by 65° (e.g., from 45° to 110° and from 225° to 290°). Thus, a phase of a version of a wireless signal that is to be transmitted or that has been received via an antenna element can be shifted to support a beamsteering operation.

Figure 5:
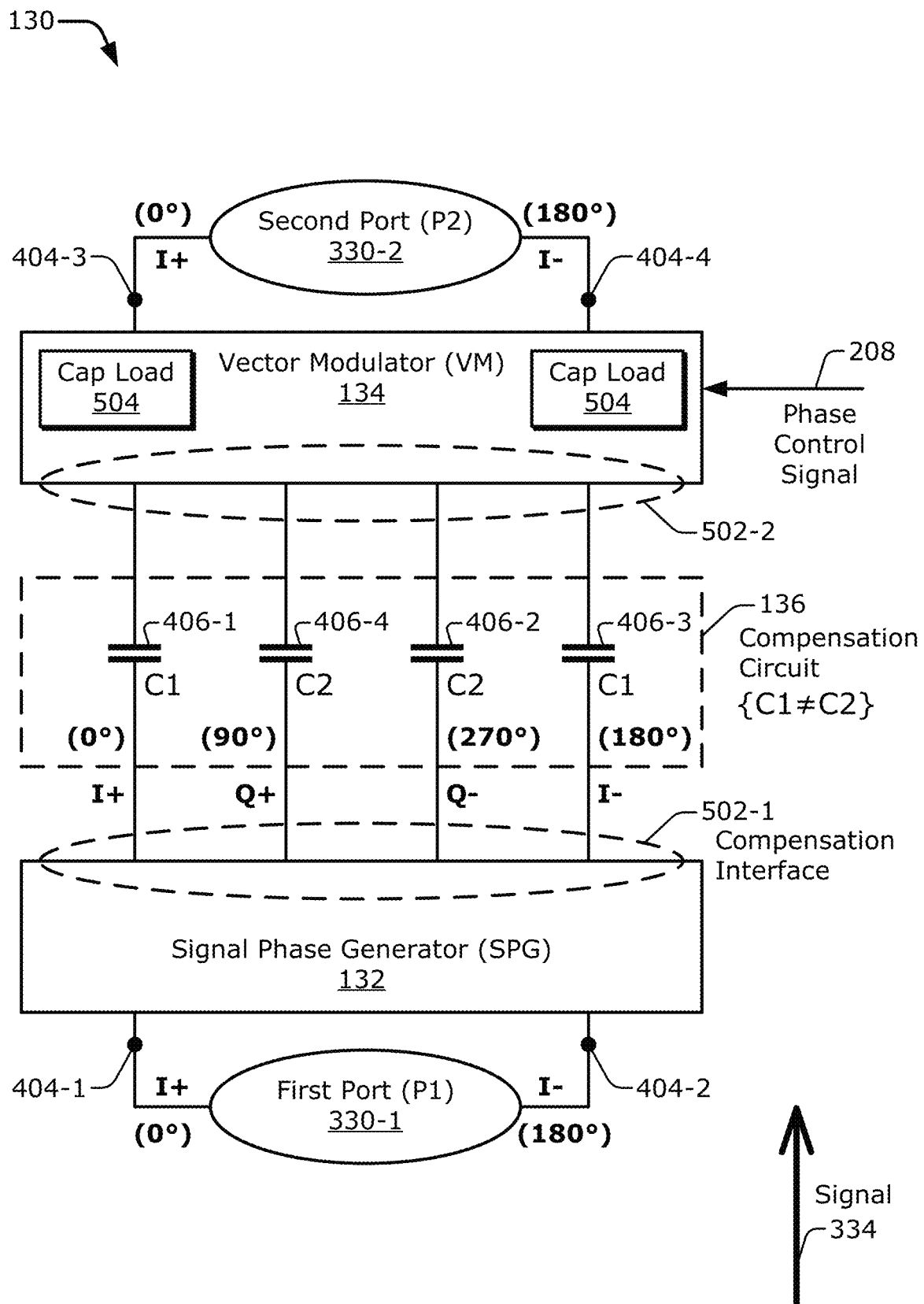
FIG. 5 is a schematic diagram illustrating an example phase shifter including a signal phase generator, a vector modulator, and an example compensation circuit with multiple capacitors.

FIG. 5 is a schematic diagram illustrating an example phase shifter 130 including a signal phase generator 132, a vector modulator 134, and an example compensation circuit 136. In this example, the compensation circuit 136 includes four capacitors 406-1, 406-2, 406-3, and 406-4 (e.g., "M" equals four (4) for the multiple capacitors 406-1 . . . 406-M of FIG. 4). As shown, each of the signal phase generator 132 and the vector modulator 134 includes a respective compensation interface 502. The signal phase generator 132 includes a compensation interface 502-1, and the vector modulator 134 includes a compensation interface 502-2. The phase shifter 130 is also depicted to include the first port 330-1 and the second port 330-2. The first port 330-1 includes the first node 404-1 (e.g., a plus node) and the second node 404-2 (e.g., a minus node). The second port 330-2 includes the third node 404-3 (e.g., another plus node) and the fourth node 404-4 (e.g., another minus node).

In example implementations, the signal phase generator 132 is coupled between the first port 330-1 and the compensation circuit 136. More specifically, the signal phase generator 132 is coupled to the compensation circuit 136 via one or more nodes (not shown in FIG. 5) of the compensation interface 502-1. The vector modulator 134 is coupled between the compensation circuit 136 and the second port 330-2. Here, the vector modulator 134 is coupled to the compensation circuit 136 via one or more nodes (not shown in FIG. 5) of the compensation interface 502-2. As shown in FIG. 5, for certain example embodiments, the compensation circuit 136 can omit or lack any inductors.

The compensation circuit 136 includes the multiple capacitors 406-1 . . . 406-4. More specifically, the compensation circuit 136 includes at least a first capacitor 406-1, a second capacitor 406-2, a third capacitor 406-3, and a fourth capacitor 406-4. Although four capacitors 406-1 to 406-4 are explicitly depicted in FIG. 5 and described herein, other implementations may include more or fewer capacitors, such as two capacitors in a single-ended circuit. In example operations, the signal phase generator 132 generates, from at least one phase component of a signal 334 propagating through the signal phase generator 132 between the first port 330-1 and the compensation circuit 136, two or more phase components of the signal 334. The vector modulator 134 modulates the signal components by adjusting an amplitude of a phase component of the two or more phase components of the signal 334 that are propagating through the vector modulator 134 between the compensation circuit 136 and the second port 330-2. Although the signal 334 is depicted in the example of FIG. 5 as flowing from the first port 330-1 to the second port 330-2, the described principles are also applicable to signals flowing in the opposite direction.

The circuit of FIG. 5 can process a differential signal. In example differential operations, a differential implementation of the signal 334 is accepted at the first port 330-1 (e.g., from an "upstream" component). The differential signal 334 includes two phase components: a first phase component and a second phase component, such as an I+ phase component at the first node 404-1 and an I− phase component at the second node 404-2. The signal phase generator 132 generates, based on the two phase components, four phase components of the differential signal 334 at the compensation interface 502-1: a first phase component, a second phase component, a third phase component, and a fourth phase component. Phase components at different nodal positions, ports, or interfaces of the phase shifter 130 may have different phases. For example, a first phase component at the first port 330-1 may have a different phase than a first phase component at the compensation interface 502-1. The four phase components of the differential signal 334 can include an I+ phase component, an I− phase component, a Q+ phase component, and a Q− phase component. Here, the four phase components can be separated from each other by 90 degrees (90°). Thus, in some cases, the first, second, third, and fourth phase components can correspond to any of the I+, I−, Q+, and Q− phase components in various orders depending on implementation, on nodal position, port, or interface within a given phase shifter, and so forth.

The phase shifter 130 propagates the four phase components across the multiple capacitors 406-1 . . . 406-4 of the compensation circuit 136 to the compensation interface 502-2. The vector modulator 134 adjusts one or more amplitudes of the four phase components to phase-shift the differential signal 334 responsive to the phase control signal 208. The phase shifter 130 recombines respective plus and minus parts of the adjusted I and Q phase components. The phase shifter 130 provides the differential signal 334 having the phase-adjusted I+ and I− phase components respectively at the third node 404-3 and the fourth node 404-4 of the second port 330-2.

In some implementations, the vector modulator 134 includes one or more amplifiers. These amplifiers include or exhibit a capacitance that is realized as at least one capacitive load 504 with respect to the signal phase generator 132. This capacitive load 504 can cause the phase components of the signal 334 to have unbalanced amplitudes at the compensation interface 502-1, absent an appropriate interface circuit between the signal phase generator 132 and the vector modulator 134. Such an interface circuit can be implemented with a matching circuit formed from multiple inductors. Inductors, however, are relatively large circuit elements that add appreciable size and cost to integrated circuits.

In contrast, the compensation circuit 136, which is electrically positioned as an interface circuit between the signal phase generator 132 and the vector modulator 134, includes the multiple capacitors 406-1 . . . 406-4 in the embodiment illustrated in FIG. 5. To maintain balanced amplitudes of the phase components of the signal 334 at the compensation interface 502-1, two or more of the capacitors of the multiple capacitors 406-1 . . . 406-4 of the compensation circuit 136 have different capacitances. The capacitances of the multiple capacitors 406-1 . . . 406-M can be fixed. Alternatively, one or more of the multiple capacitors 406-1 . . . 406-M can be implemented as an adjustable capacitor with an adjustable capacitance. With an adjustable capacitor, a capacitive value can be tuned, for example during a testing or calibration phase, to ensure amplitudes of signal components are balanced.

In some implementations, like those in which a signal 334 propagates from the first port 330-1 to the second port 330-2, the first port 330-1 provides a first mechanism for realizing an interface to accept the signal 334 from an "upstream" component and to couple the signal 334 to another part of the phase shifter 130. The signal phase generator 132 provides a generation mechanism for generating two or more phase components of the signal 334 based on at least one phase component of the signal 334. The compensation circuit 136 provides a compensation mechanism for balancing at least one amplitude of the two or more phase components generated by the generation mechanism to produce two or more balanced phase components (e.g., at the compensation interface 502-1 or 502-2). The compensation mechanism for balancing may operate using, for instance, different capacitances (e.g., unbalanced capacitors). The vector modulator 134 provides a vector modulation mechanism for adjusting the two or more balanced phase components responsive to a phase control signal 208 to produce a phase-shifted signal. The second port 330-2 provides a second mechanism for realizing an interface to accept the phase-shifted signal from the vector modulation mechanism and to forward the phase-shifted signal to a "downstream" component.

Generally, the first capacitor 406-1 has a first capacitance C1, and the second capacitor 406-2 has a second capacitance C2. To maintain an amplitude balance of the two or more phase components propagating between the signal phase generator 132 and the vector modulator 134, the first capacitance C1 may be different from the second capacitance C2 (e.g., C1≠C2). Thus, two or more of the multiple capacitors 406-1 . . . 406-4 of the compensation circuit 136 can provide a capacitive mechanism for compensating for a capacitive load 504 of the vector modulator 134. With an example differential implementation, the third capacitor 406-3 has the first capacitance C1, and the fourth capacitor 406-4 has the second capacitance C2. Thus, the first capacitance C1 of the first capacitor 406-1 can be substantially equivalent to the first capacitance C1 of the third capacitor 406-3. Similarly, the second capacitance C2 of the second capacitor 406-2 can be substantially equivalent to the second capacitance C2 of the fourth capacitor 406-4. In this context, "substantially equivalent" can include: having a capacitance that is architected to be the same as another capacitance to a degree reasonably feasible for a given capacitor design or process technology, having capacitive values that are within 5-20% of each other, a combination thereof, and so forth.

FIG. 6 illustrates an example phase shifter 130 including a vector modulator 134, a compensation circuit 136 with multiple capacitors 406-1 . . . 406-4, and a signal phase generator 132 that is implemented with an example quadrature all-pass filter (QAF) 602. Thus, the quadrature all-pass filter 602 (QAF 602) can generate, from at least one phase component of a differential signal 334 propagating through the signal phase generator 132 between the first port 330-1 and the compensation circuit 136, two or more phase components of the differential signal 334. As shown, the compensation interface 502-1 includes multiple nodes 606-1 . . . 606-4. Specifically, the compensation interface 502-1 includes four nodes: a first node 606-1, a second node 606-2, a third node 606-3, and a fourth node 606-4. However, a compensation interface 502-1 can include a different quantity of nodes. The first capacitor 406-1 is coupled between the first node 606-1 and the vector modulator 134, and the second capacitor 406-2 is coupled between the second node 606-2 and the vector modulator 134. The third capacitor 406-3 is coupled between the third node 606-3 and the vector modulator 134, and the fourth capacitor 406-4 is coupled between the fourth node 606-4 and the vector modulator 134. As shown in FIG. 6, for certain example embodiments, the first through fourth capacitors 406-1 to 406-4 may be respectively and directly connected to the first through fourth nodes 606-1 to 606-4 of the compensation interface 502-1. Alternatively, one or more intervening elements may be coupled between any of them.

In example implementations, the QAF 602 includes multiple branches 604. Each branch 604 is coupled between the first port 330-1 and the compensation circuit 136. Each branch 604 includes at least one reactive element, such as an inductor or a capacitor, to form a reactive branch. In this differential signaling environment, the QAF 602 includes four branches: a first capacitive branch 604-1, a first inductive branch 604-2, a second capacitive branch 604-3, and a second inductive branch 604-4. The first capacitive branch 604-1 includes at least one capacitor 612-1 having a capacitance C, and the second capacitive branch 604-3 includes at least one capacitor 612-2 having the capacitance C. The first inductive branch 604-2 includes at least one inductor 610-1 having an inductance L, and the second inductive branch 604-4 includes at least one inductor 610-2 having the inductance L. A resistor 608-1 having a resistance 2R is coupled between the first node 606-1 and the fourth node 606-4. Another resistor 608-2 having the resistance 2R is coupled between the second node 606-2 and the third node 606-3. Thus, at least one branch 604 of the first capacitive branch 604-1, the first inductive branch 604-2, the second capacitive branch 604-3, or the second inductive branch 604-4 can provide a branch mechanism for reactively generating the two or more phase components of the signal 334 based on the at least one phase component of the signal 334. An analogous branch mechanism for reactively generating the two or more phase components of the signal using one or more branches is described below with reference to FIG. 7.

As shown for the example QAF 602 of FIG. 6, the first capacitive branch 604-1 and the first inductive branch 604-2 are coupled to the first node 404-1 to receive the I+ phase component of the differential signal 334. The second capacitive branch 604-3 and the second inductive branch 604-4 are coupled to the second node 404-2 to receive the I− phase component of the differential signal 334. The first capacitive branch 604-1 is coupled between the first node 404-1 of the first port 330-1 and the first node 606-1 of the compensation interface 502-1. The first inductive branch 604-2 is coupled between the first node 404-1 of the first port 330-1 and the second node 606-2 of the compensation interface 502-1. The second capacitive branch 604-3 is coupled between the second node 404-2 of the first port 330-1 and the third node 606-3 of the compensation interface 502-1. The second inductive branch 604-4 is coupled between the second node 404-2 of the first port 330-1 and the fourth node 606-4 of the compensation interface 502-1.

Thus, the capacitor 612-1 of the first capacitive branch 604-1 is coupled between the first node 404-1 and the first node 606-1. The first capacitor 406-1 is therefore coupled between the capacitor 612-1 of the first capacitive branch 604-1 and the vector modulator 134. The capacitor 612-2 of the second capacitive branch 604-3 is coupled between the second node 404-2 and the third node 606-3. The third capacitor 406-3 is therefore coupled between the capacitor 612-2 of the second capacitive branch 604-3 and the vector modulator 134. Similarly, the inductor 610-1 of the first inductive branch 604-2 is coupled between the first node 404-1 and the second node 606-2. The second capacitor 406-2 is therefore coupled between the inductor 610-1 of the first inductive branch 604-2 and the vector modulator 134. The inductor 610-2 of the second inductive branch 604-4 is coupled between the second node 404-2 and the fourth node 606-4. The fourth capacitor 406-4 is therefore coupled between the inductor 610-2 of the second inductive branch 604-4 and the vector modulator 134.

Accordingly, as depicted in FIG. 6, the first inductive branch 604-2 is cross-coupled with the second inductive branch 604-4, with respect to plus and minus parts of differential signaling (e.g., a differential implementation of the signal 334), between the first port 330-1 and the compensation circuit 136. As such, the first inductive branch 604-2 is coupled between a plus part of the differential signal 334 (e.g., the I+ phase component) at the first port 330-1 and a minus part of the differential signal 334 (e.g., the Q− phase component) at the compensation interface 502-1. Correspondingly, the second inductive branch 604-4 is coupled between a minus part of the differential signal 334 (e.g., the I− phase component) at the first port 330-1 and a plus part of the differential signal 334 (e.g., the Q+ phase component) at the compensation interface 502-1.

To account for the capacitive load 504 in the vector modulator 134, and to counteract the resulting potential for unbalanced amplitudes at the compensation interface 502-1, the first capacitance C1 is set to be unequal to the second capacitance C2 in the embodiment illustrated in FIG. 6. As shown in the figure, the capacitors of the compensation circuit 136 that are connected to the capacitive branches of the QAF 602 both have the first capacitance C1. In this example, the first capacitance C1 is greater than the second capacitance C2. The first capacitive branch 604-1 and the second capacitive branch 604-3 are therefore connected to capacitors having the higher first capacitance C1, which capacitors are the first capacitor 406-1 and the third capacitor 406-3. A ratio (C1/C2) of the first capacitance C1 to the second capacitance C2 can be equal to or greater than approximately two (2). For example, the ratio (C1/C2) of the first capacitance C1 to the second capacitance C2 can be equal to or greater than approximately three (3). For instance, the ratio C1/C2 can range between approximately two (2) and five (5). Thus, the first capacitance C1 can be different from the second capacitance C2 by a factor of approximately two or more.

Figure 7:
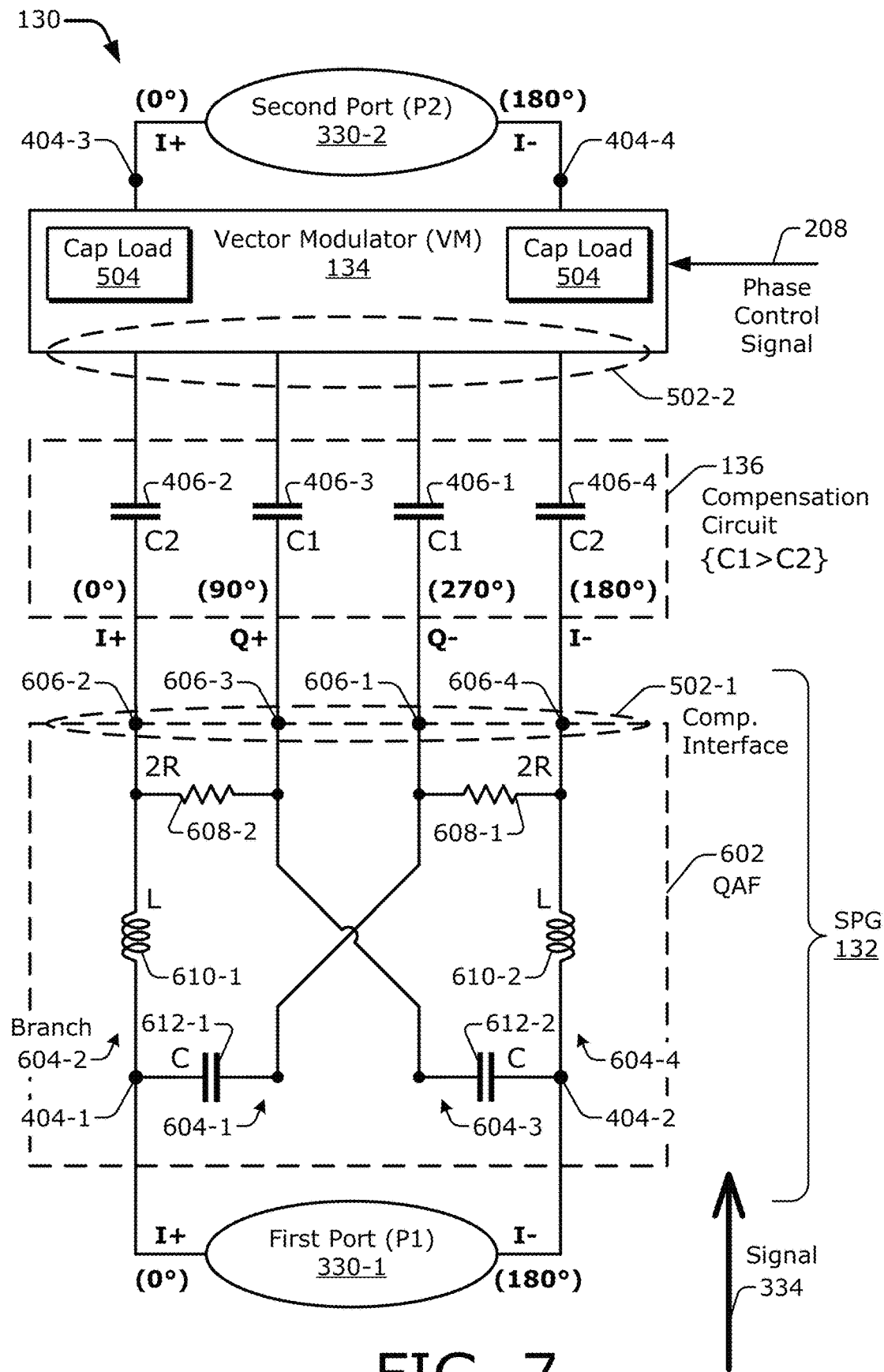
FIG. 7 illustrates another example phase shifter including a vector modulator, a compensation circuit with multiple capacitors, and a signal phase generator implemented with another example QAF.

FIG. 7 illustrates another example phase shifter 130 including a vector modulator 134, a compensation circuit 136 with multiple capacitors 406-1 . . . 406-4, and a signal phase generator 132 that is implemented as another example QAF 602. The QAF 602 of FIG. 7 is similar to the QAF 602 of FIG. 6. However, instead of the two inductive branches being cross-coupled like in FIG. 6, the two capacitive branches are cross-coupled in FIG. 7. Accordingly, as depicted in FIG. 7, the first capacitive branch 604-1 is cross-coupled with the second capacitive branch 604-3, with respect to plus and minus parts of the differential implementation of the signal 334, between the first port 330-1 and the compensation circuit 136. As such, the first capacitive branch 604-1 is coupled between a plus part of the differential signal 334 (e.g., the I+ phase component) at the first port 330-1 and a minus part of the differential signal 334 (e.g., the Q− phase component) at the compensation interface 502-1. Correspondingly, the second capacitive branch 604-3 is coupled between a minus part of the differential signal 334 (e.g., the I− phase component) at the first port 330-1 and a plus part of the differential signal 334 (e.g., the Q+ phase component) at the compensation interface 502-1.

For the QAF implementation of the signal phase generator 132 in FIG. 7, the QAF 602 can generate, from at least one phase component of a differential signal 334 propagating through the QAF 602 between the first port 330-1 and the compensation circuit 136, two or more phase components of the differential signal 334. Thus, a greater quantity of phase components of the differential signal 334 is present at the compensation interface 502-1 than at the first port 330-1. Like in FIG. 6, the compensation circuit 136 counteracts the potential amplitude-unbalancing effects of the capacitive load 504 on the phase components of the differential signal 334 at the compensation interface 502-1. To account for the capacitive load 504 in the vector modulator 134, and to counteract the resulting potential for unbalanced amplitudes at the compensation interface 502-1, the first capacitance C1 may be set to be unequal to the second capacitance C2.

As shown in FIG. 7, the capacitors of the compensation circuit 136 that are connected to the capacitive branches of the QAF 602 both have the first capacitance C1. In this example, the first capacitance C1 is established to be greater than the second capacitance C2 because the first capacitor 406-1 is connected to the capacitor 612-1 of the first capacitive branch 604-1, and the third capacitor 406-3 is connected to the capacitor 612-2 of the second capacitive branch 604-3. Thus, the capacitors of the compensation circuit 136 having the relatively larger capacitive values are connected to the capacitors of the QAF 602, and the capacitors of the compensation circuit 136 having the relatively smaller capacitive values are connected to the inductors of the QAF 602. The relative capacitive values of the first capacitance C1 and the second capacitance C2 can be set as described above with reference to FIG. 6. For instances, a ratio of C1/C2 can be at least approximately two to three.

The amplitude balancing that is provided by having relatively higher capacitive values for those capacitors that are connected to the two capacitive branches of the QAF as compared to those capacitors that are connected to the two inductive branches of the QAF is described below.

Figure 8:
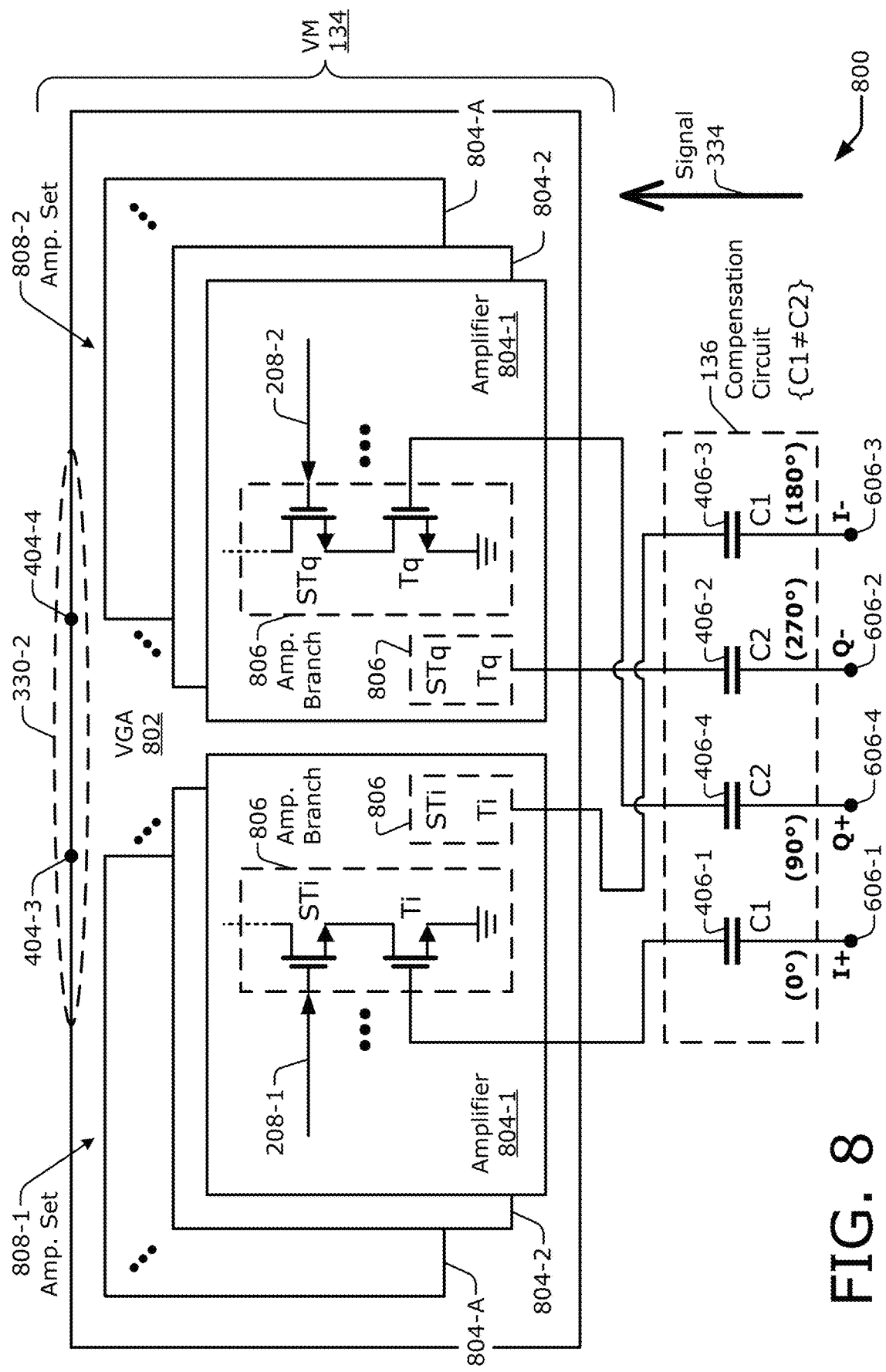
FIG. 8 illustrates a portion of a phase shifter with an example vector modulator implementation including a variable-gain amplifier (VGA) that includes multiple amplifiers.

FIG. 8 illustrates a portion 800 of a phase shifter with an example vector modulator 134 (VM 134) that is implemented with a variable-gain amplifier 802 (VGA 802). The VGA 802 includes multiple amplifiers 804-1, 804-2, . . . , 804-A, with the variable "A" representing any positive integer, such as 3, 4, 5, or 7. The example VGA 802 is described with reference to a compensation circuit 136 that can be employed with the QAF 602 of FIG. 6. However, the described principles for the VGA 802 are also applicable to the QAF 602 of FIG. 7.

In example implementations, the VGA 802 is separated into two portions: one portion for amplifying I phase component(s) and another portion for amplifying Q phase component(s) of a differential signal 334. As depicted on the left, a first portion of the VGA 802 corresponds to an amplifier set 808-1 that includes multiple amplifiers 804-1 . . . 804-A. The amplifier set 808-1 processes the I+ phase component and the I− phase component. As depicted on the right, a second portion of the VGA 802 corresponds to an amplifier set 808-2 that includes other multiple amplifiers 804-1 . . . 804-A. The amplifier set 808-2 processes the Q+ phase component and the Q− phase component.

Each amplifier set 808 includes "A" amplifiers 804-1 to 804-A. The quantity "A" can correspond to a quantity of bits of the phase shifter or a maximum available phase-shift granularity. For example, for A=3, a phase-shift increment between adjacent phase-shift amounts may be 45°. A phase-shift increment may be 22.5° for A=4, and a phase-shift increment may be 11.25° for A=5. In some cases, a quantity "A" of amplifiers 804-1 to 804-A in each amplifier set 808 can correspond to a quantity of bits of the phase control signal 208. Further, the phase control signal 208 can include an I-component phase control signal 208-1 for the amplifier set 808-1 and a Q-component phase control signal 208-2 for the amplifier set 808-2.

To facilitate providing different amplification amounts, each amplifier 804 in each amplifier set 808 can be weighted. Example weighting schemes include binary weighting, thermometer coding, logarithmic weighting, and so forth. In an example binary-weighting scheme with A=5, amplification amounts can correspond to 1×, 2×, 4×, 8×, and 16×. Providing different weights for each amplifier 804 can be implemented in various manners. For example, transistors with different sizes can be used (e.g., transistor widths can be scaled) across the multiple amplifiers 804-1 . . . 804-A in each amplifier set 808. Additionally or alternatively, different quantities of transistors can be used (e.g., quantities of transistors with the same widths can be scaled) across the multiple amplifiers 804-1 . . . 804-A in each amplifier set 808. Other approaches to implementing different amplification amounts or different amplifier weights can be used.

Each amplifier 804 includes at least one amplification branch 806. In some implementations, each amplification branch 806 includes at least one transistor T for amplification and at least one switch transistor ST for enabling the amplification in that branch. Each transistor can be implemented as, for example, a field-effect transistor (FET). If so, each transistor includes a gate terminal, a source terminal, and a drain terminal. For the amplifier set 808-1, the amplification branch 806 (e.g., a first amplification branch) includes a transistor Ti and a switch transistor STi. By way of example, the transistor Ti and the switch transistor STi can each be implemented as an n-type metal-oxide-semiconductor (MOS) FET (nMOSFET). Thus, the transistors of the VGA 802 may be implemented using complementary metal-oxide-semiconductor (CMOS) technology. However, the multiple amplifiers 804-1 . . . 804-A can be implemented using different transistor types, such as a bipolar junction transistor (BJT), a p-type MOSFET (pMOSFET), a junction FET (JFET), depletion or enhancement mode transistors, and so forth.

The transistor Ti and the switch transistor STi are coupled together in series between a voltage supply (not shown in FIG. 8) and a ground. The source terminal of the transistor Ti is coupled to the ground. The gate terminal of the transistor Ti is coupled so as to receive an I phase component of the signal 334. As shown, the gate terminal of the transistor Ti is coupled to the first capacitor 406-1 to receive the I+ phase component. A gate terminal of another transistor Ti (not shown explicitly in FIG. 8 for clarity) in another amplification branch 806 of the amplifier 804-1 of the amplifier set 808-1 is coupled to the third capacitor 406-3 to receive the I− phase component. This is illustrated more clearly in FIG. 9. The drain terminal of the transistor Ti is coupled to the source terminal of the switch transistor STi. The drain terminal of the switch transistor STi is coupled to the voltage supply. The gate terminal of the switch transistor STi is coupled to receive at least one bit of the I-component phase control signal 208-1.

In example operations, the I+ and I− phase components of the differential signal 334 are coupled to gate terminals of the two transistors Ti via the first capacitor 406-1 and the third capacitor 406-3. The two transistors Ti amplify the I phase components based on the two switch transistors STi being turned on to enable amplification in the amplification branches 806 for the respective amplifier 804 by the I-component phase control signal 208-1. In this implementation, each of the amplification transistors Ti is configured as a common-source (CS) amplifier (e.g., the transistor is used in a common-source (CS) amplifier configuration). Thus, as shown in FIG. 8, at least one transistor Ti provides a common-source amplification mechanism for amplifying two or more balanced phase components, which are coupled to the amplifier 804 via the compensation circuit 136, responsive to the phase control signal 208 (e.g., the I-component phase control signal 208-1).

The amplification transistor Ti can, however, be configured in an alternative manner, such as a common-gate (CG) amplifier. With a CG amplifier configuration, the source terminal of the transistor Ti can be coupled to the first capacitor 406-1 to receive a balanced phase component from the compensation circuit 136. The gate terminal of the transistor Ti is coupled to a bias voltage (not shown) for the CG amplifier configuration. At least one transistor Ti that is connected in this manner provides a common-gate amplification mechanism for amplifying, responsive to the phase control signal 208, two or more balanced phase components, which are coupled to the amplifier 804 via the compensation circuit 136. The CG amplifier configuration can be employed, for example, to enable a bidirectional vector modulator 134. Further, some embodiments may omit the switch transistors STi and STq, for example in implementations which use other means for enabling and disabling the amplifiers 804 and/or varying an amount of gain provided by the VGA 802.

The CS amplifier configuration can use less power than the CG amplifier configuration in some embodiments because direct-current (DC) current need not flow through the compensation circuit 136 or the signal phase generator 132. In the illustrated CS amplifier configuration, a capacitance of the transistor Ti can impact operation of the phase shifter. The interface between the gate terminal and the source terminal of the transistor Ti produces a capacitive effect that can be modeled as a gate-source (GS) capacitance between the gate terminal and the ground. This GS capacitance interacts with the reactive components of the QAF 602 (e.g., of FIG. 6). More specifically, the GS capacitance of the transistors Ti and Tq effectively increases the capacitance of the capacitors of the two capacitive branches and effectively decreases the inductance of the inductors of the two inductive branches.

This condition, absent a compensation circuit 136 as described herein, can produce unbalanced amplitudes between the signal phase generator 132 and the vector modulator 134. Employing unbalanced capacitors in the compensation circuit 136 can "restore" or maintain balanced amplitudes of the phase components of the differential signal 334 between the signal phase generator 132 and the vector modulator 134. To do so, the capacitors of the compensation circuit 136 with relatively higher capacitances are coupled to the QAF branches with capacitors as compared to the capacitors of the compensation circuit 136 that are coupled to the QAF branches with inductors. The first capacitor 406-1 and the third capacitor 406-3 form with the GS capacitance of the two transistors Ti a capacitor-based analog to a voltage divider that is constructed with resistors. Because the first capacitance C1 is greater than the second capacitance C2, the capacitor-based voltage divider rebalances the amplitudes of the phase components that are to be amplified by each amplification branch 806 of the multiple amplifiers 804-1 . . . 804-A of the amplifier set 808-1. In these manners, the lower-power CS amplifier configuration can be used as part of a phase shifter without relying on relatively larger inductors for a matching circuit disposed between a signal phase generator and a vector modulator. Instead, relatively smaller capacitors can be used as part of a compensation circuit 136 that couples a signal phase generator 132 to a vector modulator 134 in a phase shifter 130, as described herein.

The amplifier set 808-2 operates analogously for the Q phase components of the differential signal 334 as does the amplifier set 808-1 for the I phase components. The amplification branch 806 (e.g., a second amplification branch) of the amplifier set 808-2 includes a transistor Tq and a switch transistor STq. The transistor Tq and the switch transistor STq are coupled together in series between the voltage supply (not shown in FIG. 8) and the ground. The source terminal of the transistor Tq is coupled to the ground. The gate terminal of the transistor Tq is coupled so as to receive a Q phase component of the differential signal 334. As shown, the gate terminal of the transistor Tq is coupled to the fourth capacitor 406-4 to receive the Q+ phase component. A gate terminal of another transistor Tq (not shown explicitly in FIG. 8 for clarity) in another amplification branch 806 of the amplifier 804-1 of the amplifier set 808-2 is coupled to the second capacitor 406-2 to receive the Q− phase component. These two amplification branches are illustrated more clearly in FIG. 9.

The drain terminal of the transistor Tq is coupled to the source terminal of the switch transistor STq. The drain terminal of the switch transistor STq is coupled to the voltage supply. The gate terminal of the switch transistor STq is coupled to receive at least one bit of the Q-component phase control signal 208-2. In example operations, the Q+ and Q− phase components of the differential signal 334 are coupled to gate terminals of the two transistors Tq via the fourth capacitor 406-4 and the second capacitor 406-2, respectively. The two transistors Tq amplify the Q phase components based on the two switch transistors STq being turned on to enable amplification in the amplification branches 806 for the respective amplifier 804 by the Q-component phase control signal 208-2.

Figure 9:
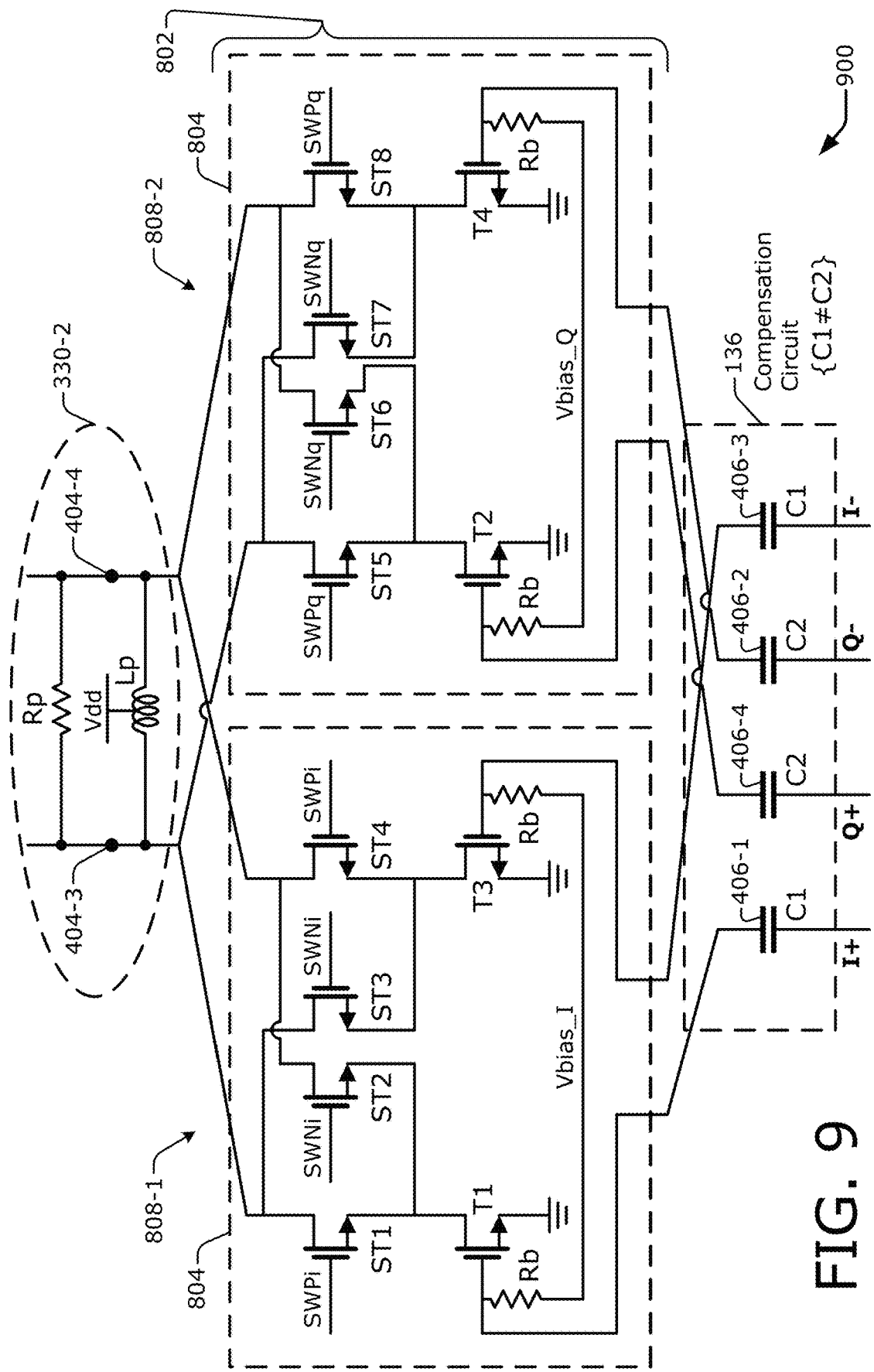
FIG. 9 illustrates example amplifiers of the VGA that is depicted in FIG. 8 for a vector modulator of a phase shifter.

FIG. 9 illustrates at 900 generally example amplifiers of a VGA 802 for a vector modulator 134 (e.g., of FIG. 8) of a phase shifter 130. Both the amplifier set 808-1 and the amplifier set 808-2 include multiple amplifiers 804-1 . . . 804-A as depicted in FIG. 8. In FIG. 9, one amplifier 804 is illustrated for each amplifier set 808 for clarity. The amplifier 804 of the amplifier set 808-1 includes a first transistor T1, a third transistor T3, and switch transistors ST1, ST2, ST3, and ST4. The amplifier 804 of the amplifier set 808-2 includes a second transistor T2, a fourth transistor T4, and switch transistors ST5, ST6, ST7, and ST8.

In example implementations, each amplification branch 806 (of FIG. 8) includes a transistor T and at least one switch transistor ST. One amplification branch of the amplifier 804 of the amplifier set 808-1 includes the first transistor T1 and at least one of the switch transistor ST1 or the switch transistor ST2. Another amplification branch of the same amplifier 804 includes the third transistor T3 and at least one of the switch transistor ST3 or the switch transistor ST4. One amplification branch of the amplifier 804 of the amplifier set 808-2 includes the second transistor T2 and at least one of the switch transistor ST5 or the switch transistor ST6. Another amplification branch of the same amplifier 804 includes the fourth transistor T4 and at least one of the switch transistor ST7 or the switch transistor ST8.

The second port 330-2 may include, in addition to the third node 404-3 and the fourth node 404-4, a port inductor Lp and a port resistor Rp. The port inductor Lp and the port resistor Rp are coupled together in parallel between the third node 404-3 and the fourth node 404-4. The port inductor Lp is coupled (e.g., at a center tap) to a power rail to provide a supply voltage Vdd. The gate terminals of the first transistor T1 and the third transistor T3 are coupled to an I-component bias voltage (Vbias_I) via respective bias resistors Rb. The gate terminals of the second transistor T2 and the fourth transistor T4 are coupled to a Q-component bias voltage (Vbias_Q) via respective other bias resistors Rb. The first capacitor 406-1 is coupled to the gate terminal of the first transistor T1 and the third capacitor 406-3 is coupled to the gate terminal of the third transistor T3 to provide to the amplifier 804 of the amplifier set 808-1 the I+ and I− phase components, respectively, of the signal being phase shifted. The fourth capacitor 406-4 is coupled to the gate terminal of the second transistor T2 and the second capacitor 406-2 is coupled to the gate terminal of the fourth transistor T4 to provide to the amplifier 804 of the amplifier set 808-2 the Q+ and Q− phase components, respectively, of the signal being phase shifted.

The first transistor T1 and the switch transistor ST1 are coupled together in series between the third node 404-3 and the ground. The third transistor T3 and the switch transistor ST4 are coupled together in series between the fourth node 404-4 and the ground. The second transistor T2 and the switch transistor ST5 are coupled together in series between the third node 404-3 and the ground. The fourth transistor T4 and the switch transistor ST8 are coupled together in series between the fourth node 404-4 and the ground. The signal components are therefore recombined at the third node 404-3 and the fourth node 404-4 for plus and minus parts of a differential signal being phase shifted. Using this described configuration with switch transistors ST1, ST4, ST5, and ST8, the associated phase shifter can shift a propagating signal between 0 and 180 degrees.

The illustrated configuration, however, includes four additional switch transistors ST2, ST3, ST6, and ST7 to enable sign-switching and thus the ability to shift a phase of a propagating signal between 0 and 360 degrees. The first transistor T1 and the switch transistor ST2 are coupled together in series between the fourth node 404-4 and the ground. The third transistor T3 and the switch transistor ST3 are coupled together in series between the third node 404-3 and the ground. The second transistor T2 and the switch transistor ST6 are coupled together in series between the fourth node 404-4 and the ground. The fourth transistor T4 and the switch transistor ST7 are coupled together in series between the third node 404-3 and the ground. The switch transistors ST2, ST3, ST6, and ST7 can individually or jointly change a polarity of a balanced phase component that is accepted from one or more of the multiple capacitors 406-1 . . . 406-4 of the compensation circuit 136. Thus, at least one of the switch transistors ST2, ST3, ST6, or ST7 provides a sign-switching mechanism for changing a polarity of at least one balanced phase component of the two or more balanced phase components, which are provided via the compensation circuit 136, responsive to the phase control signal 208.

The control signals SWPi and SWNi correspond to the I-component phase control signal 208-1 (of FIG. 8). The control signals SWPq and SWNq correspond to the Q-component phase control signal 208-2 (of FIG. 8). For shifting into the first quadrant, the control signals SWPi and SWPq are activated. In this context, an activated control signal corresponds to a voltage level that turns on the corresponding switch transistor to enable amplification by the corresponding amplification branch. For shifting into the second quadrant, the control signals SWNi and SWPq are activated. Thus, for this second quadrant case, sign-switching is engaged for the I+ and I− phase components of the signal being phase shifted. For shifting into the third quadrant, the control signals SWNi and SWNq are both activated. For this third quadrant case, sign-switching is engaged for both the I+/I− phase components and Q+/Q− phase components of the signal being phase shifted. For shifting into the fourth quadrant, the control signals SWPi and SWNq are activated. Thus, for this fourth quadrant case, sign-switching is engaged for the Q+ and Q− phase components of the signal being phase shifted.

A first amplification branch, such as for the amplifier set 808-1, can include the first transistor T1 and at least one switch transistor. With the first transistor T1 deployed in a sign-switching implementation, the at least one switch transistor can include the switch transistor ST1 and the switch transistor ST2. In this example, the switch transistor ST1 comprises a plus switch transistor, and the switch transistor ST2 comprises a minus switch transistor. Similarly, a second amplification branch, such as for the amplifier set 808-2, can include the second transistor T2 and at least one other switch transistor. With the second transistor T2 deployed in a sign-switching implementation, the at least one other switch transistor can include the switch transistor ST5 and the switch transistor ST6. Here, the switch transistor ST5 comprises a plus switch transistor, and the switch transistor ST6 comprises a minus switch transistor. In some embodiments, the additional switch transistors ST2, ST3, ST6, and ST7 are omitted.

Figure 10:
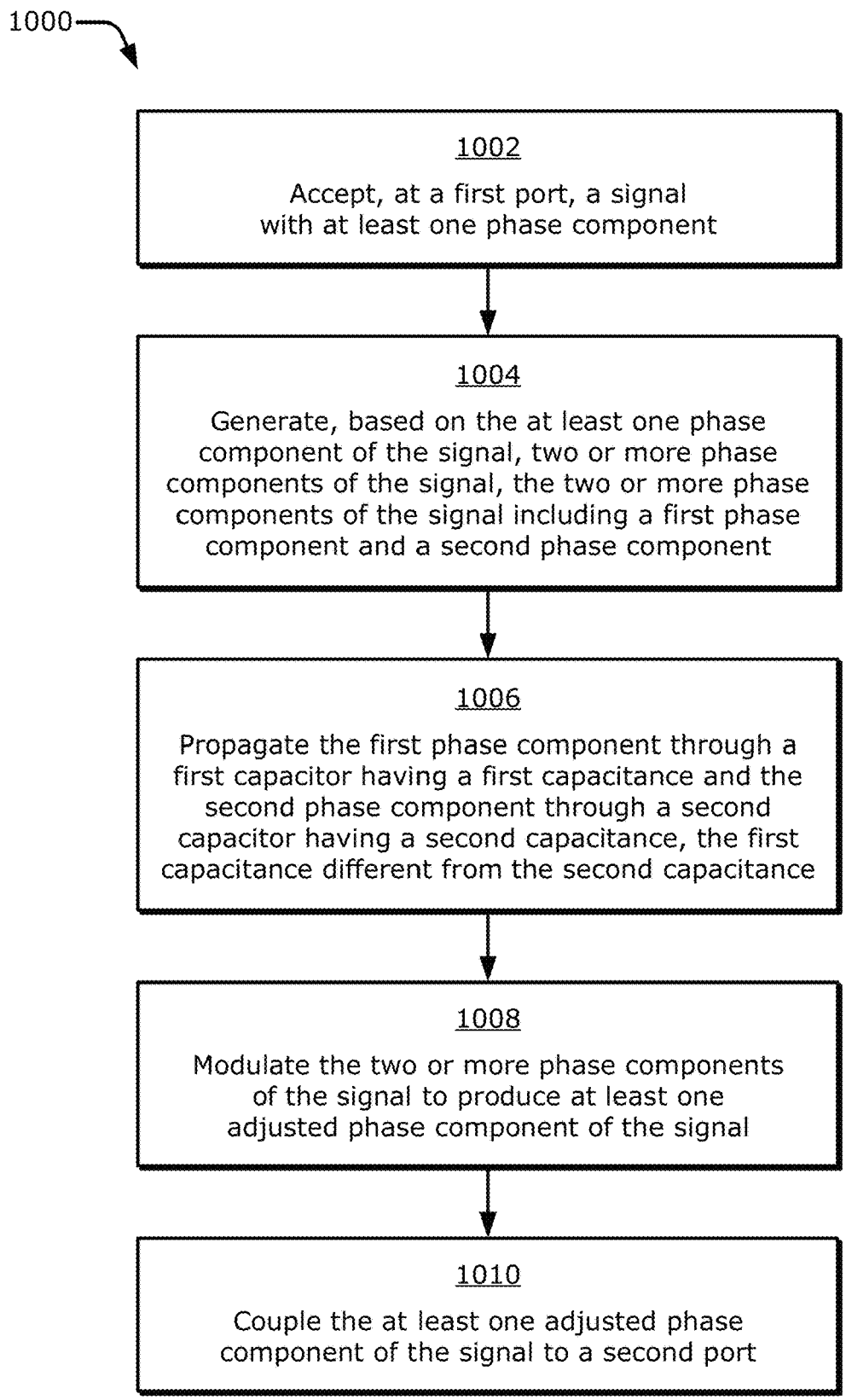
FIG. 10 is a flow diagram illustrating an example process for operating a phase shifter with a compensation circuit.

FIG. 10 is a flow diagram illustrating an example process 1000 for operating a phase shifter with a compensation circuit. The process 1000 is described in the form of a set of blocks 1002-1010 that specify operations that can be performed. However, operations are not necessarily limited to the order shown in FIG. 10 or described herein, for the operations may be implemented in alternative orders or in fully or partially overlapping manners. Also, more, fewer, and/or different operations may be implemented to perform the process 1000, or an alternative process. Operations represented by the illustrated blocks of the process 1000 may be performed by a phase shifter 130 or a portion thereof in conjunction with a controller 212 (e.g., of FIG. 2). More specifically, the operations of the process 1000 may be performed by a signal phase generator 132, a compensation circuit 136, and a vector modulator 134.

At block 1002, a signal with at least one phase component is accepted at a first port. For example, a phase shifter 130 can accept, at a first port 330-1, a signal 334 with at least one phase component (e.g., at least an I phase component). For instance, the first port 330-1 may accept a differential signal 334 having an I+ phase component and an I− phase component at a first node 404-1 and a second node 404-2, respectively.

At block 1004, based on the at least one phase component of the signal, two or more phase components of the signal are generated. The two or more phase components of the signal include a first phase component and a second phase component. For example, a signal phase generator 132 can generate, based on the at least one phase component (e.g., at least an I+ phase component) of the signal 334, two or more phase components (e.g., at least an I+ phase component and a Q+ phase component) of the signal 334. Thus, the two or more phase components that are generated can include a first phase component (e.g., the I+ phase component) and a second phase component (e.g., the Q+ phase component) of the signal 334. This generation may be performed by multiple reactive branches 604 of a quadrature all-pass filter 602 (QAF 602). In implementations with two capacitive and two inductive branches (e.g., branches 604-1 to 604-4), the QAF 602 may produce the first phase component, the second phase component, a third phase component, and a fourth phase component (e.g., I+, I−, Q+, and Q− phase components) at an output of the QAF 602 from a first phase component and a second phase component (e.g., I+ and I− phase components) that are present at an input of the QAF 602. Thus, the signal phase generator 132 can cause a propagating signal to have a greater quantity of phases on an output side than on an input side of the signal phase generator 132.

At block 1006, the first phase component is propagated through a first capacitor having a first capacitance, and the second phase component is propagated through a second capacitor having a second capacitance, with the first capacitance being different from the second capacitance. For example, a compensation circuit 136 can respectively propagate the first phase component and the second phase component (e.g., at least two phase components that are separated by 90° of the differential signal 334 through a first capacitor 406-1 having a first capacitance C1 and a second capacitor 406-2 having a second capacitance C2. Here, the first capacitance C1 is different from the second capacitance C2. This can produce two or more balanced phase components. The difference between the first capacitance C1 and the second capacitance C2 is greater than would be expected due to a variability in manufacturing or due to transient environmental conditions (e.g., dissimilar or changing temperatures). In some cases, first, second, third, and fourth phase components that are each separated by 90° (e.g., I+, Q+, and Q− phase components) may each be propagated through one of four capacitors: the first capacitor 406-1, the second capacitor 406-2, a third capacitor 406-3, and a fourth capacitor 406-4. With an unbalanced capacitance provided by the first capacitance C1 and the second capacitance C2, the propagating of block 1006 can include balancing one or more amplitudes of the two or more phase components of the differential signal 334 using the unbalanced capacitance.

At block 1008, the two or more phase components of the signal are modulated to produce at least one adjusted phase component of the signal. For example, a vector modulator 134 can modulate the two or more phase components (e.g., at least the I+ or the Q+ phase component) of the signal 334 to produce at least one adjusted phase component of the signal 334. For instance, the vector modulator 134 may use at least one amplification branch 806 per respective phase component to amplify each respective phase component responsive to a phase control signal 208. The amplification can produce one or more adjusted phase components of the signal 334 by increasing or decreasing an amplitude of each of the two or more phase components of the signal 334. For some phase shift operations, a particular amplifier may pass a phase component without changing an amplitude thereof. In some cases, both plus and minus switching transistors may be present to enable sign-switching to extend a phase-shift range to 360°.

At block 1010, the at least one adjusted phase component of the signal is coupled to a second port. For example, the phase shifter 130 can couple the at least one adjusted phase component of the signal 334 to a second port 330-2. To do so, an output of each amplification branch 806 can be coupled to at least one of a third node 404-3 or a fourth node 404-4 of the phase shifter 130, with the second port 330-2 including the third node 404-3 and the fourth node 404-4.

As used herein, "couple," "coupled," or "coupling" refers to a relationship between two or more components that are in operative communication magnetically, electromagnetically, or by being electrically connected to implement some feature or realize some capability that is described. The term "connect," "connected," or "connecting" refers to an electrical connection using a physical line, such as a metal trace or wire. In some cases, an electrical connection can include a resistor, a capacitor, an inductor, a transistor, and so forth. A connection can include a direct connection or an indirect connection. A direct connection refers to connecting discrete circuit elements via a same node without an intervening element. An indirect connection refers to connecting discrete circuit elements via one or more other devices or other discrete circuit elements.

The terms "first," "second," "third," and other numeric-related indicators or differentiators are used herein to identify or distinguish similar or analogous items from one another within a given context. Here, such contexts include a particular implementation, a given component, a single drawing figure or a group of related drawing figures, or a claim. Thus, a first item in one context may be the same as or may differ from a first item in another context. For example, an item identified as a "first capacitor" or a "first inductive branch" in one context may be identified for clarity purposes as a "second capacitor" or an "inductive branch," respectively, in another context.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for phase-shifting signals, the apparatus comprising:
   a phase shifter comprising:
      a first port;
      a second port;
      a compensation circuit comprising a first capacitor with a first capacitive value and a second capacitor with a second capacitive value, a ratio of the first capacitive value to the second capacitive value ranging between approximately two and five;
      a signal phase generator coupled between the first port and the compensation circuit and comprising multiple branches, each branch of the multiple branches coupled between the first port and the compensation circuit, the multiple branches comprising:
         at least one capacitive branch; and
         at least one inductive branch; and
      a vector modulator coupled between the compensation circuit and the second port,
      the first capacitor coupled between the at least one capacitive branch and the vector modulator, and
      the second capacitor coupled between the at least one inductive branch and the vector modulator.

2. The apparatus of claim 1, wherein the signal phase generator comprises a quadrature all-pass filter (QAF).

3. The apparatus of claim 1, further comprising:
   a power amplifier coupled to an output of the phase shifter.

4. The apparatus of claim 1, further comprising:
   a low-noise amplifier coupled to an input of the phase shifter.

5. The apparatus of claim 1, further comprising:
   a power amplifier comprising an input; and
   a low-noise amplifier comprising an output,
   wherein the phase shifter is coupled to the input of the power amplifier and to the output of the low-noise amplifier.

6. The apparatus of claim 1, wherein the vector modulator is configured to amplify at least one phase component of a signal responsive to a phase control signal.

7. The apparatus of claim 1, wherein the compensation circuit comprises:
   a third capacitor with a capacitive value that is at least substantially equivalent to the first capacitive value; and
   a fourth capacitor with a capacitive value that is at least substantially equivalent to the second capacitive value.

8. The apparatus of claim 7, wherein:
   the at least one capacitive branch of the signal phase generator comprises a first capacitive branch and a second capacitive branch;
   the at least one inductive branch of the signal phase generator comprises a first inductive branch and a second inductive branch;

the first capacitor is coupled between the first capacitive branch and the vector modulator;
the second capacitor is coupled between the first inductive branch and the vector modulator;
the third capacitor is coupled between the second capacitive branch and the vector modulator; and
the fourth capacitor is coupled between the second inductive branch and the vector modulator.

9. The apparatus of claim 8, wherein the first inductive branch is cross-coupled with the second inductive branch, with respect to plus and minus parts of differential signaling, between the first port and the compensation circuit.

10. The apparatus of claim 8, wherein the first capacitive branch is cross-coupled with the second capacitive branch, with respect to plus and minus parts of differential signaling, between the first port and the compensation circuit.

11. The apparatus of claim 8, wherein:
the first capacitor is directly connected to the first capacitive branch;
the second capacitor is directly connected to the first inductive branch;
the third capacitor is directly connected to the second capacitive branch;
the fourth capacitor is directly connected to the second inductive branch; and
the compensation circuit lacks an inductor.

12. The apparatus of claim 1, wherein the apparatus comprises a smartphone.

13. The apparatus of claim 1, wherein:
the vector modulator comprises:
 a first amplification branch; and
 a second amplification branch;
the first capacitor is coupled between the signal phase generator and the first amplification branch; and
the second capacitor is coupled between the signal phase generator and the second amplification branch.

14. The apparatus of claim 13, wherein:
the first amplification branch comprises a first transistor;
the second amplification branch comprises a second transistor;
the first capacitor is coupled between the signal phase generator and the first transistor; and
the second capacitor is coupled between the signal phase generator and the second transistor.

15. The apparatus of claim 14, wherein:
the first capacitor is coupled between the signal phase generator and a gate terminal of the first transistor;
the second capacitor is coupled between the signal phase generator and a gate terminal of the second transistor;
the first transistor is implemented in a common-source (CS) amplifier configuration, and the second transistor is implemented in a CS amplifier configuration; and
the first transistor and the second transistor are implemented using complementary metal-oxide-semiconductor (CMOS) technology.

16. The apparatus of claim 14, wherein the first amplification branch comprises at least one switch transistor coupled in series with the first transistor between the first capacitor and the second port.

17. The apparatus of claim 16, wherein:
the at least one switch transistor comprises a plus switch transistor and a minus switch transistor;
the second port comprises a plus node and a minus node;
the plus switch transistor is coupled between the first transistor and the plus node of the second port; and
the minus switch transistor is coupled between the first transistor and the minus node of the second port.

18. The apparatus of claim 1, wherein:
the signal phase generator is configured to generate, from at least one phase component of a signal propagating through the signal phase generator between the first port and the compensation circuit, two or more phase components of the signal; and
the vector modulator is configured to adjust an amplitude of a phase component of the two or more phase components of the signal propagating through the vector modulator between the compensation circuit and the second port.

19. The apparatus of claim 1, wherein:
the first port comprises a first node and a second node;
the second port comprises two or more nodes;
the compensation circuit comprises a third capacitor with a capacitive value that is at least substantially equivalent to the first capacitive value and a fourth capacitor with a capacitive value that is at least substantially equivalent to the second capacitive value;
the vector modulator is coupled between the compensation circuit and the two or more nodes of the second port; and
the signal phase generator comprises:
 a capacitor coupled between the first node of the first port and the first capacitor;
 an inductor coupled between the first node of the first port and the second capacitor;
 another capacitor coupled between the second node of the first port and the third capacitor; and
 another inductor coupled between the second node of the first port and the fourth capacitor.

20. The apparatus of claim 19, further comprising:
a compensation interface coupled between the signal phase generator and the compensation circuit, the compensation interface comprising a first node, a second node, a third node, and a fourth node, wherein:
the signal phase generator comprises a resistor and another resistor;
the capacitor and the first capacitor are coupled to the first node of the compensation interface;
the inductor and the second capacitor are coupled to the second node of the compensation interface;
the other capacitor and the third capacitor are coupled to the third node of the compensation interface;
the other inductor and the fourth capacitor are coupled to the fourth node of the compensation interface;
the resistor is coupled between the first node of the compensation interface and the fourth node of the compensation interface; and
the other resistor is coupled between the second node of the compensation interface and the third node of the compensation interface.

21. The apparatus of claim 1, further comprising:
an antenna array comprising multiple antenna elements, at least one antenna element of the multiple antenna elements coupled to the phase shifter; and
a wireless interface device coupled to the antenna array, the wireless interface device comprising the phase shifter and configured to steer, using the phase shifter, wireless signals communicated via the antenna array.

22. The apparatus of claim 21, further comprising:
a display screen; and
a processor operatively coupled to the display screen and at least a portion of the wireless interface device, the processor configured to present one or more graphical images on the display screen based on the wireless signals communicated by the wireless interface device using the phase shifter.

23. An apparatus for phase-shifting signals, the apparatus comprising:
a phase shifter comprising:
means for generating two or more phase components of a signal based on at least one phase component of the signal, the means for generating comprising at least one capacitive branch and at least one inductive branch;
means for balancing at least one amplitude of the two or more phase components generated by the means for generating to produce two or more balanced phase components, the means for balancing comprising a first capacitor with a first capacitive value and a second capacitor with a second capacitive value, a ratio of the first capacitive value to the second capacitive value ranging between approximately two and five;
means for adjusting the two or more balanced phase components responsive to a phase control signal to produce a phase-shifted signal;
means for interfacing with the means for generating to provide the signal to the means for generating; and
means for interfacing with the means for adjusting to accept the phase-shifted signal from the means for adjusting.

24. The apparatus of claim 23, wherein the means for generating comprises:
means for reactively generating the two or more phase components of the signal based on the at least one phase component of the signal.

25. The apparatus of claim 23, wherein the means for balancing comprises:
means for compensating for a capacitive load of the means for adjusting.

26. The apparatus of claim 23, wherein the means for adjusting comprises at least one of:
means for amplifying the two or more balanced phase components responsive to the phase control signal using at least one common-gate amplifier; or
means for amplifying the two or more balanced phase components responsive to the phase control signal using at least one common-source amplifier.

27. A method for operating a phase shifter with a compensation circuit, the method comprising:
accepting, at a first port, a signal with at least one phase component;
generating, based on the at least one phase component of the signal, two or more phase components of the signal using at least one capacitive branch and at least one inductive branch, the two or more phase components of the signal comprising a first phase component and a second phase component;
propagating the first phase component through a first capacitor having a first capacitive value and the second phase component through a second capacitor having a second capacitive value, a ratio of the first capacitive value to the second capacitive value ranging between approximately two and five;
modulating the two or more phase components of the signal to produce at least one adjusted phase component of the signal; and
coupling the at least one adjusted phase component of the signal to a second port.

28. The method of claim 27, wherein the generating comprises propagating the at least one phase component of the signal at least partially through multiple reactive branches of a signal phase generator including the at least one capacitive branch and the at least one inductive branch.

29. The method of claim 27, wherein the propagating comprises balancing one or more amplitudes of the two or more phase components of the signal using an unbalanced capacitance that results from the first capacitive value and the second capacitive value.

30. The method of claim 27, wherein the modulating comprises amplifying, responsive to a phase control signal, the two or more phase components of the signal to produce the at least one adjusted phase component of the signal.

* * * * *